United States Patent
Lee et al.

(10) Patent No.: US 11,594,595 B2
(45) Date of Patent: Feb. 28, 2023

(54) CAPACITOR STRUCTURE AND SEMICONDUCTOR DEVICE INCLUDING THE SAME

(71) Applicant: Samsung Electronics Co., Ltd., Suwon-si (KR)

(72) Inventors: Jong-Min Lee, Hwaseong-si (KR); Hyongsoo Kim, Hwaseong-si (KR); Jongryul Jun, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/156,773

(22) Filed: Jan. 25, 2021

(65) Prior Publication Data

US 2021/0183994 A1   Jun. 17, 2021

Related U.S. Application Data

(63) Continuation of application No. 16/787,426, filed on Feb. 11, 2020, now Pat. No. 10,903,310, which is a continuation of application No. 15/897,931, filed on Feb. 15, 2018, now Pat. No. 10,665,664, which is a continuation of application No. 15/159,809, filed on May 20, 2016, now Pat. No. 9,917,147.

(30) Foreign Application Priority Data

Jun. 15, 2015   (KR) .................. 10-2015-0084206

(51) Int. Cl.
*H01L 27/108* (2006.01)
*H01L 49/02* (2006.01)

(52) U.S. Cl.
CPC ........ *H01L 28/90* (2013.01); *H01L 27/10852* (2013.01)

(58) Field of Classification Search
CPC ............ H01L 27/108–10897; H01L 28/90–92
See application file for complete search history.

(56) References Cited

U.S. PATENT DOCUMENTS

| | | |
|---|---|---|
| 7,420,238 B2 | 9/2008 | Manning et al. |
| 7,700,469 B2 | 4/2010 | Benson |
| 7,897,474 B2 | 3/2011 | Eto |
| 8,154,064 B2 | 4/2012 | Manning et al. |
| 8,283,236 B2 | 10/2012 | Goodner et al. |
| 8,652,926 B1 | 2/2014 | Lugani et al. |
| 8,704,283 B2 | 4/2014 | Kim et al. |

(Continued)

FOREIGN PATENT DOCUMENTS

| JP | 2014-241325 | 12/2014 |
|---|---|---|
| KR | 10-2005-0059697 | 6/2005 |

(Continued)

*Primary Examiner* — Andres Munoz
(74) *Attorney, Agent, or Firm* — Muir Patent Law, PLLC

(57) ABSTRACT

A capacitor structure includes a plurality of bottom electrodes horizontally spaced apart from each other, a support structure covering sidewalls of the bottom electrodes, a top electrode surrounding the support structure and the bottom electrodes, and a dielectric layer interposed between the support structure and the top electrode, and between the top electrode and each of the bottom electrodes. An uppermost surface of the support structure is positioned at a higher level than an uppermost surface of each of the bottom electrodes.

13 Claims, 27 Drawing Sheets

(56) References Cited

U.S. PATENT DOCUMENTS

| | | | |
|---|---|---|---|
| 8,884,350 B2 | 11/2014 | Hirota et al. | |
| 8,912,629 B2 | 12/2014 | Seo | |
| 9,147,685 B2 | 9/2015 | Byun et al. | |
| 9,287,349 B2 | 3/2016 | Kim et al. | |
| 9,449,977 B2 | 9/2016 | Seo | |
| 10,903,310 B2* | 1/2021 | Lee | H01L 28/90 |
| 2010/0155892 A1 | 6/2010 | Benson | |
| 2010/0187101 A1 | 7/2010 | Kim et al. | |
| 2012/0098092 A1 | 4/2012 | Park et al. | |
| 2012/0187533 A1 | 7/2012 | Goodner et al. | |
| 2012/0235279 A1 | 9/2012 | Seo | |
| 2013/0147048 A1 | 6/2013 | Kuh et al. | |
| 2013/0228837 A1 | 9/2013 | Sukekawa et al. | |
| 2013/0249053 A1* | 9/2013 | Lee | H01L 28/40 257/532 |
| 2013/0285202 A1 | 10/2013 | Koyanagi et al. | |

FOREIGN PATENT DOCUMENTS

| | | |
|---|---|---|
| KR | 10-2008-0085557 | 9/2008 |
| KR | 10-0949898 B1 | 3/2010 |
| KR | 20100086795 A | 8/2010 |
| KR | 101115180 B1 | 2/2012 |
| KR | 10-2012-0104810 | 9/2012 |
| KR | 10-2014-0136143 | 11/2014 |
| KR | 101800419 B1 | 11/2017 |

* cited by examiner

CAPACITOR STRUCTURE AND SEMICONDUCTOR DEVICE INCLUDING THE SAME

CROSS-REFERENCE TO RELATED APPLICATIONS

This U.S. non-provisional patent application is a continuation application of U.S. patent application Ser. No. 16/787,426, filed Feb. 11, 2020, which is a continuation application of U.S. patent application Ser. No. 15/897,931, filed Feb. 15, 2018, which is a continuation application of U.S. patent application Ser. No. 15/159,809, filed May 20, 2016, which claims priority under 35 U.S.C. § 119 to Korean Patent Application No. 10-2015-0084206, filed on Jun. 15, 2015, in the Korean Intellectual Property Office, the entire contents of each of which are hereby incorporated by reference.

BACKGROUND

Example embodiments of the inventive concept relate to a semiconductor device, and more particularly, to a capacitor structure and a semiconductor device including the same.

As semiconductor devices become more highly integrated, it is important to realize a capacitor having sufficiently high capacitance in a limited area. The capacitance of the capacitor is proportional to a surface area of an electrode and a dielectric constant of dielectric film and is inversely proportional to an equivalent oxide thickness of the dielectric film. This means that the capacitance of a capacitor can be increased by, for example, forming a capacitor of a three dimensional electrode to increase a surface area thereof, decreasing an equivalent oxide thickness of the dielectric film or using a dielectric film with a high dielectric constant.

The surface of the electrode can be increased by, for example, increasing a height of a bottom electrode (or a storage electrode), increasing an effective surface of the bottom electrode using an HSG (Hemi-Spherical Grain) or forming a cylindrical bottom electrode, of which both inner and outer side surfaces can be used as the surface area of the capacitor.

SUMMARY

According to example embodiments of the inventive concept, a capacitor structure may include a plurality of bottom electrodes horizontally spaced apart from each other, a support structure covering sidewalls of the bottom electrodes, a top electrode surrounding the support structure and the bottom electrodes, and a dielectric layer interposed between the support structure and the top electrode, and between the top electrode and each of the bottom electrodes. An uppermost surface of the support structure is positioned at a higher level than an upper most surface of the bottom electrodes.

In example embodiments, the support structure may include an upper support pattern and a lower support pattern vertically spaced apart from each other. The upper support pattern may be in contact with an upper portion of a sidewall of each of the bottom electrodes and the lower support pattern may be in contact with a lower portion of the sidewall of each of the bottom electrodes.

In example embodiments, an upper surface of the upper support pattern may be positioned at a higher level than the uppermost surface of each of the bottom electrodes.

In example embodiments, the upper support pattern may have a sidewall exposed above the uppermost surface of each of the bottom electrodes.

In example embodiments, the uppermost surface of each of the bottom electrodes may be directly contact with the dielectric layer.

In example embodiments, the top electrode may cover the upper surface of the upper support pattern and the exposed sidewall, and may extend on the uppermost surface of the each of the bottom electrodes.

In example embodiments, the top electrode may be provided between the upper support pattern and the lower support pattern and under the lower support pattern to cover the sidewalls of the bottom electrodes.

In example embodiments, each of the bottom electrodes may penetrate the lower support pattern.

In example embodiments, a lower surface of the lower support pattern may be positioned at a higher level than a lowest surface of each of the bottom electrodes.

In example embodiments, at least a portion of the top electrode may penetrate the upper support pattern and the lower support pattern to cover the sidewalls of the bottom electrodes.

In example embodiments, the upper and lower support patterns may include a plurality of upper and lower openings, respectively. At least the portion of top electrode may penetrate the upper supper pattern through the upper openings. At least the portion of the top electrode may penetrate the lower supper pattern through the lower openings, and each of the upper and lower openings has an inner sidewall contacting the bottom electrodes.

In example embodiments, when viewed in a plan view, the upper openings and the lower openings may overlap each other.

In example embodiments, the bottom electrodes may be inserted in the top electrode, and the support structure may be provided in the top electrode to contact with the sidewalls of the bottom electrodes.

According to example embodiments of the inventive concept, a semiconductor device may include transistors on a substrate and a capacitor structure connected to the transistors. The capacitor structure may include a top electrode on the substrate, a plurality of bottom electrodes inserted in the top electrode and connected to the transistors, respectively, a support structure provided in the top electrode and covering a portion of sidewalls of the bottom electrodes, and a dielectric layer interposed between the support structure and the top electrode, and between each of the bottom electrodes and the top electrode. An uppermost surface of the support structure may be positioned at higher level than an uppermost surface of each of the bottom electrodes.

In example embodiments, the support structure may include an upper support pattern on the substrate and a lower support pattern provided between the substrate and the upper support pattern and spaced apart from the upper support pattern. The upper support pattern may be in contact with an upper portion of a sidewall of each of the bottom electrodes and the lower support pattern may be in contact with a lower portion of the sidewall of each of the bottom electrodes.

In example embodiments, an upper surface of the upper support pattern may be positioned at a higher level than the uppermost surface of each of the bottom electrodes.

In example embodiments, the upper support pattern may have a sidewall exposed above the uppermost surface of each of the bottom electrodes.

In example embodiments, the top electrode may cover the upper surface of the upper support pattern and the exposed sidewall, and may extend on the uppermost surface of each of the bottom electrodes.

In example embodiments, the top electrode may be provided between the upper support pattern and the lower support pattern, and under the lower support pattern to cover the sidewalls of the bottom electrodes.

In example embodiments, each of the bottom electrodes may be connected to one terminal of each of the transistors by penetrating the lower support pattern.

In example embodiments, a lower surface of the lower support pattern may be positioned at a higher level than a lowest surface of each of the bottom electrodes.

In example embodiments, the support structure may have a plurality of openings. The top electrode may penetrate the support structure through the plurality of openings.

In example embodiments, the semiconductor device may further include bit lines connected to the transistors. Each of the bottom electrodes may be connected to one terminal of each of the transistors, and the other terminal of each of the transistors is connected to a corresponding one of the bit lines.

According to example embodiments of the inventive concept, a capacitor structure may include a plurality of bottom electrodes horizontally spaced apart from each other, a support structure covering sidewalls of the bottom electrodes, a top electrode surrounding the support structure and the bottom electrodes, and a dielectric layer interposed between the support structure and the top electrode, and between the top electrode and each of the bottom electrodes. The support structure may include an upper support pattern and a lower support pattern vertically spaced apart from each other. An upper surface of the upper support pattern may be positioned at a higher level than the uppermost surface of each of the bottom electrodes.

In example embodiments, the upper support pattern may have a thickness greater than that of the lower support pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
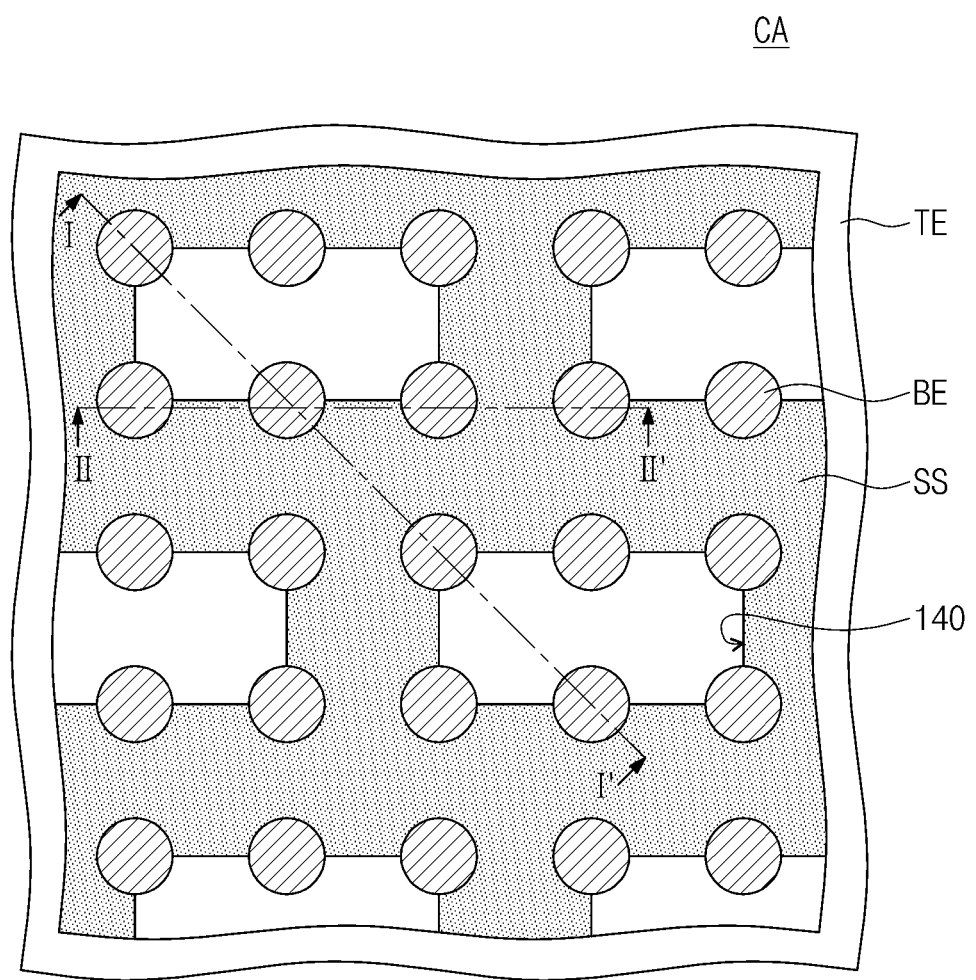
FIG. 1 is a plan view illustrating a capacitor structure of a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another element or "in contact with" another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims, without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. Terms such as "exactly" or "identical" may be used to indicate no such variation.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
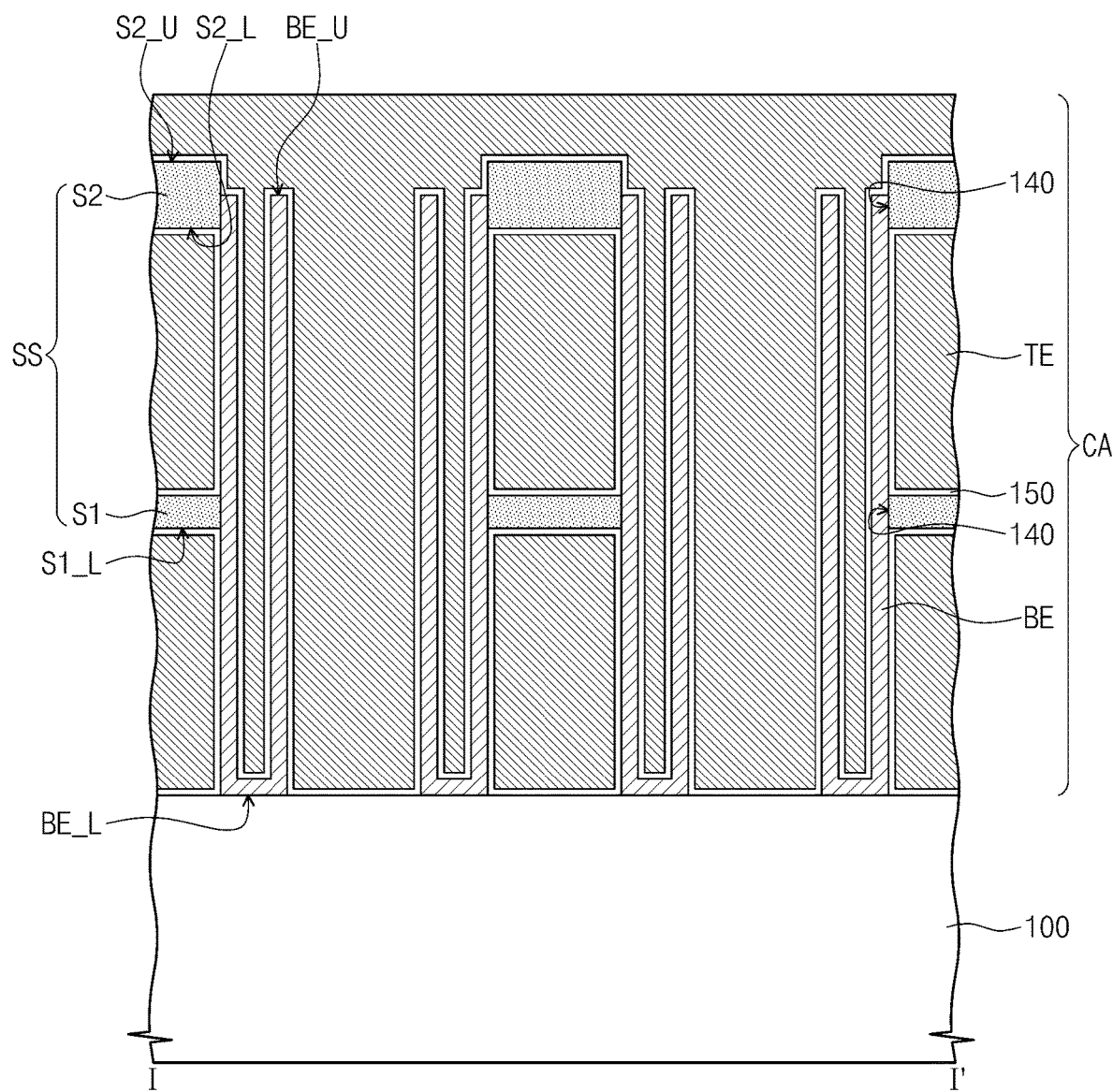
FIGS. 2 and 3 are exemplary cross-sectional views taken along lines I-I' and II-II' of the FIG. 1, respectively.
Figure 3:
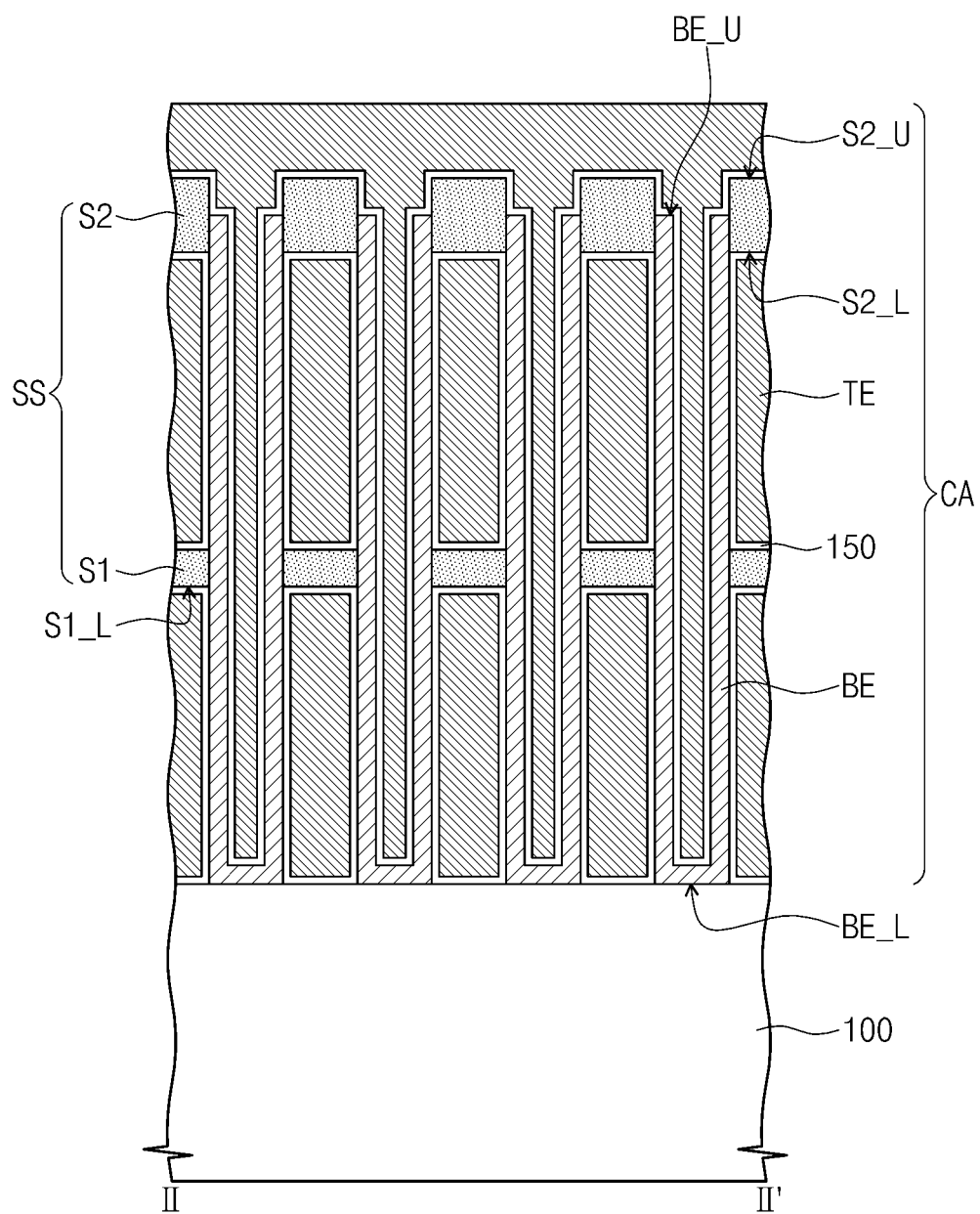

FIG. 1 is a plan view illustrating a capacitor structure of a semiconductor device according to example embodiments of the inventive concept, and FIGS. 2 and 3 are cross-sectional views taken along lines I-I' and II-II' of the FIG. 1, respectively.

Referring to FIGS. 1 to 3, a capacitor structure CA may be provided on a lower structure 100. The lower structure 100 may include a semiconductor substrate, semiconductor devices and insulating layers. The capacitor structure CA may include a plurality of bottom electrodes BE, a support structure SS supporting the bottom electrodes BE and a top electrode TE covering the bottom electrodes BE and the support structure SS.

The bottom electrodes BE may be provided on the lower structure 100 to be horizontally spaced apart from each other. When viewed in a plan view, the bottom electrodes BE may be two-dimensionally arranged on the lower structure 100. In example embodiments, each of the bottom electrodes BE, as shown FIGS. 2 and 3, may be shaped like a bottom-closed hollow cylinder. As an example, the bottom electrode may be cup-shaped.

The support structure SS may include a plurality of support patterns that are provided at vertical positions different from each other to structurally support the bottom electrodes BE. In example embodiments, the support structure SS may include a lower support pattern S1 and an upper support pattern S2, which are vertically spaced apart from each other. The lower support pattern S1 may be provided between the lower structure 100 and the upper support pattern S2. The lower support pattern S1 may cover a lower portion of a sidewall of each of the bottom electrodes BE (e.g., part of a bottom half of the sidewall), and the upper support pattern S2 may cover an upper portion of the sidewall of each of the bottom electrodes BE (e.g., part of the top half of the sidewall). The lower support pattern S1 may be in contact with the lower portion of the sidewall of each of the bottom electrodes BE, and the upper support pattern S2 may be in contact with the upper portion of the sidewall of each of the bottom electrodes BE.

Each of the lower and upper support patterns S1 and S2 may include a plurality of openings 140. When viewed in a plan view, each of the plurality of openings 140 of the upper support pattern S2 may overlap a corresponding one of the plurality of openings 140 of the lower support pattern S1. Each of the plurality of openings 140 may have an inner sidewall contacting with at least one or more bottom electrodes BE. Each of the plurality of openings 140 may expose at least one or more bottom electrodes BE.

Each of the bottom electrodes BE may vertically extend through the lower support pattern S1. A lowest surface BE_L of each of the bottom electrodes BE may be positioned at a lower level than a lower surface S1_L of the lower support pattern S1. At least one or more bottom electrodes BE may penetrate the lower support pattern S1, and may be in contact with the inner sidewall corresponding to one of the plurality of openings 140 of the lower support pattern S1.

Each of the bottom electrodes BE may partially penetrate the upper support pattern S2. Each of the bottom electrodes BE may be in contact with a lower portion of a sidewall of the upper support pattern S2, and may expose an upper portion of the sidewall of the upper support pattern S2. The result may be that the upper support pattern S2 has the sidewall exposed above an uppermost surface BE_U of each of the bottom electrodes BE. Accordingly, an upper surface S2_U of the upper support pattern S2 may be positioned at a higher level than the uppermost surface BE_U of each of the bottom electrodes BE, and a lower surface S2_L of the upper support pattern S2 may be positioned at a lower level than the uppermost surface BE_U of each of the bottom electrodes BE. The uppermost surface BE_U of each of the bottom electrodes BE may be located between the upper surface S2_U and the lower surface S2_L of the upper support pattern S2. At least one or more bottom electrodes BE may be exposed by a lower portion of one of the plurality of openings 140, and may be exposed by an upper portion of the opening as well.

The top electrode TE may surround the support structure SS and the bottom electrodes BE. The bottom electrodes BE may be inserted in the top electrode TE, and the top electrode TE may cover the upper surface and sidewalls of the bottom electrodes BE. As shown in the FIG. 2, in the case where the bottom electrode BE is cup-shaped, the bottom electrode BE may include an inner sidewall and an outer sidewall, which are provided to opposite to each other. In this case, the top electrode TE may cover the outer sidewall of each of the bottom electrodes BE, and may extend on the inner sidewall of each of the bottom electrodes BE.

The support structure SS may be provided in the top electrode TE to contact the sidewalls of the bottom electrodes BE. As shown in the FIG. 2, in the case where the bottom electrode BE is cup-shaped, the support structure SS may be in contact with the outer sidewall of the bottom electrode BE. The support structure SS may be provided in the form embedded in the top electrode TE. As an example, the top electrode TE may include horizontal portions and vertical portions. The horizontal portions may be provided on the upper support pattern S2, between the upper and lower support patterns S2 and S1 and under the lower support pattern S1. The vertical portions may penetrate the plurality of openings 140 to be connected to the horizontal portions.

The top electrode TE may cover the upper surface S2_U and the upper portion of the sidewall of the upper support pattern S2 and may extend on the uppermost surface BE_U of the bottom electrodes BE. The top electrode TE may be provided between the upper support pattern S2 and the lower support pattern S1 and under the lower support pattern S1 to cover the sidewalls of the bottom electrodes BE. At least a portion of the top electrode TE may cover the sidewalls of the bottom electrodes BE through the plurality of openings 140 which penetrate the upper support pattern S2 and the lower support pattern S1.

The capacitor structure CA may further include a dielectric layer 150 that is interposed between the support structure SS and the top electrode TE, and between each of the bottom electrodes BE and the top electrode TE. The bottom electrodes BE may be electrically isolated from the top electrode TE by the dielectric layer 150.

The bottom electrodes BE and the top electrode TE may include at least one of polycrystalline silicon, metal, metal silicide and metal nitride. The dielectric layer 150 may include at least one of oxide material (e.g., a silicon oxide layer), nitride material (e.g., a silicon nitride layer), oxynitride material (e.g., a silicon oxynitride layer) or high-k dielectric material (e.g., a hafnium oxide layer). The lower and upper support patterns S1 and S2 may include insulation materials. As an example, the lower and upper support patterns S1 and S2 may include at least one of oxide material, nitride material and oxynitride material.

In general, each of the bottom electrodes BE may have a high aspect ratio in order to increase a capacitance of the capacitor. In this case, the support structure SS may be employed for a structural stabilization of the bottom electrodes BE. In the case where the support structure SS is formed to include a plurality of support patterns that are vertically spaced apart from each other, each of the bottom electrodes BE may be formed to have a portion protruding from an uppermost surface of the support structure SS. In this case, the protruding portions of the bottom electrodes BE may be easily bent and thereby form an electrically conducting bridge between the bottom electrodes adjacent to each other. This bridge can cause an electrical failure.

According to example embodiments of the inventive concept, the support structure SS may include the lower support pattern S1 and the upper support pattern S2, which are vertically spaced apart from each other. The uppermost surface S2_U of the support structure SS may be positioned at a higher level than the uppermost surface BE_U of each of the bottom electrodes BE. That is, an upper end portion of each of the bottom electrodes BE may be in contact with one sidewall of the upper support pattern S2. Accordingly, the upper end portion of each of the bottom electrodes BE may be prevented from being bent. Accordingly, the capacitor structure can be provided with improved electrical properties.

FIGS. 4, 6, 8, 10, 12 and 14 are cross-sectional views taken along the line I-I' of FIG. 1 to illustrate a method of manufacturing a capacitor structure of a semiconductor device according to example embodiments of the inventive concept. FIGS. 5, 7, 9, 11, 13 and 15 are cross-sectional views taken along the line II-II' of FIG. 1 to illustrate a method of manufacturing a capacitor structure of a semiconductor device according to example embodiments of the inventive concept.

Figure 4:
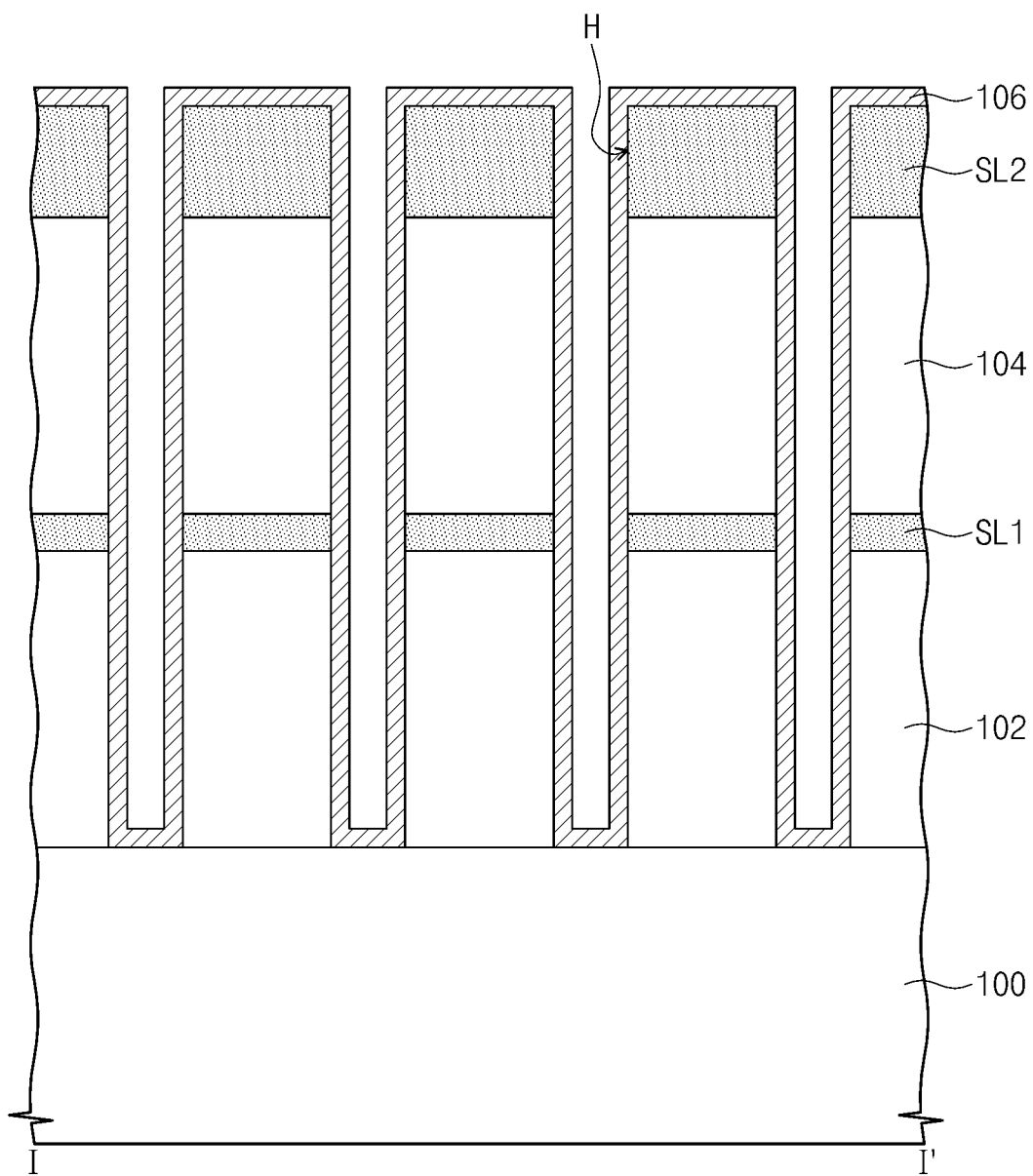
FIGS. 4, 6, 8, 10, 12 and 14 are cross-sectional views taken along the line I-I' of the FIG. 1 to illustrate a method of manufacturing a capacitor structure of a semiconductor device according to example embodiments of the inventive concept.
Figure 5:
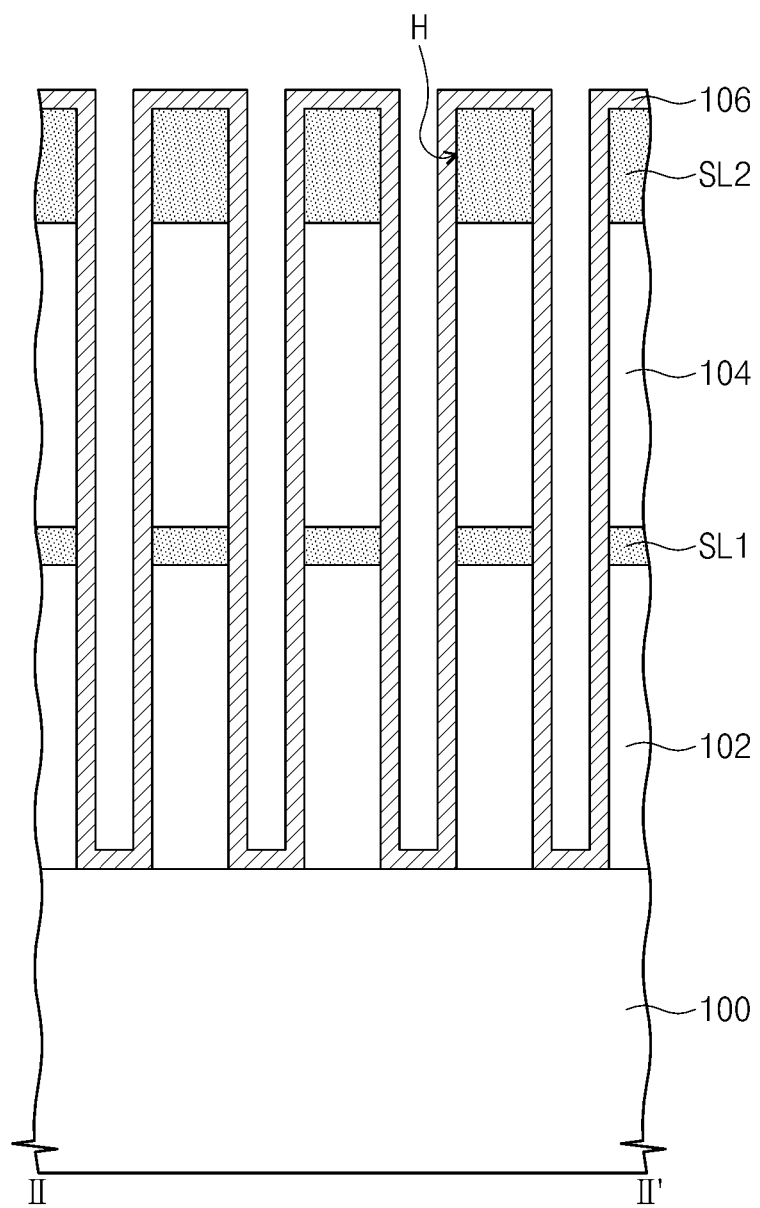
FIGS. 5, 7, 9, 11, 13 and 15 are cross-sectional views taken along the line II-II' of the FIG. 1 to illustrate a method of manufacturing a capacitor structure of a semiconductor device according to example embodiments of the inventive concept.

Referring to FIGS. 4 and 5, a first mold layer 102, a first support layer SL1, a second mold layer 104 and a second support layer SL2 may be sequentially formed on a lower structure 100. The lower structure 100 may include a semiconductor substrate, semiconductor devices and insulating layers. An uppermost layer of the lower structure 100 may be a planarized insulating layer. The insulating layer may be formed of high density plasma (HDP) oxide, tetraethylorthosilicate (TEOS), plasma enhanced tetraethylorthosilicate (PE-TEOS), O3-tetraethylorthosilicate (O3-TEOS), undoped silicate glass (USG), phosphosilicate glass (PSG), borosilicate glass (BSG), borophosphosilicate glass (BPSG), fluoride silicate glass (FSG), spin on glass (SOG), tonen siazene (TOSZ) or any combination thereof. Furthermore, the insulating layer may be formed, for example, of silicon nitride, silicon oxynitride or low-k dielectric material.

The first mold layer 102 and the second mold layer 104 may be formed of, for example, a silicon oxide layer. The first support layer SL1 and the second support layer SL2 may be formed of a material having an etch selectivity with respect to the first and second mold layers 102 and 104. As an example, the first and second support layers SL1 and SL2 may be formed of at least one of silicon nitride (SiN), silicon carbide nitride (SiCN), tantalum oxide (TaO) and titanium oxide (TiO). In example embodiments, the second support layer SL2 may have a thickness substantially equal to or greater than that of the first support layer SL1. Each of the first mold layer 102, the first support layer SL1, the second mold layer 104 and the second support layer SL2 may be formed by performing a deposition process, such as a chemical vapor deposition (CVD) process or a physical vapor deposition (PVD) process.

Holes H may be formed to expose the lower structure 100 through the stacked layers 102, SL1, 104 and SL2. The holes H may be disposed horizontally spaced apart from each other on the lower structure 100. The holes H may be two-dimensionally arranged on the lower structure 100. The formation of the holes H may include forming mask patterns on the second support layer SL2 to define a region for forming the holes, and sequentially etching the second support layer SL2, the second mold layer 104, the first support layer SL1 and the first mold layer 102 using the mask patterns as an etch mask.

A bottom electrode layer 106 may be formed on the lower structure 100 to partially fill the holes H. A deposition of the bottom electrode layer 106 may be performed using one of deposition techniques having an excellent property of step coverage such as a chemical vapor deposition (CVD), a physical vapor deposition (PVD) or an atomic layer deposition (ALD). In example embodiments, as shown in the FIGS. 4 and 5, the bottom electrode layer may be formed to conformally cover an inner wall of each of the holes H. However, in other embodiments, the bottom electrode layer 106 may be formed to completely fill the holes H. The bottom electrode layer 106 may include, for example, at least one of metal, metal silicide and metal nitride.

Figure 6:
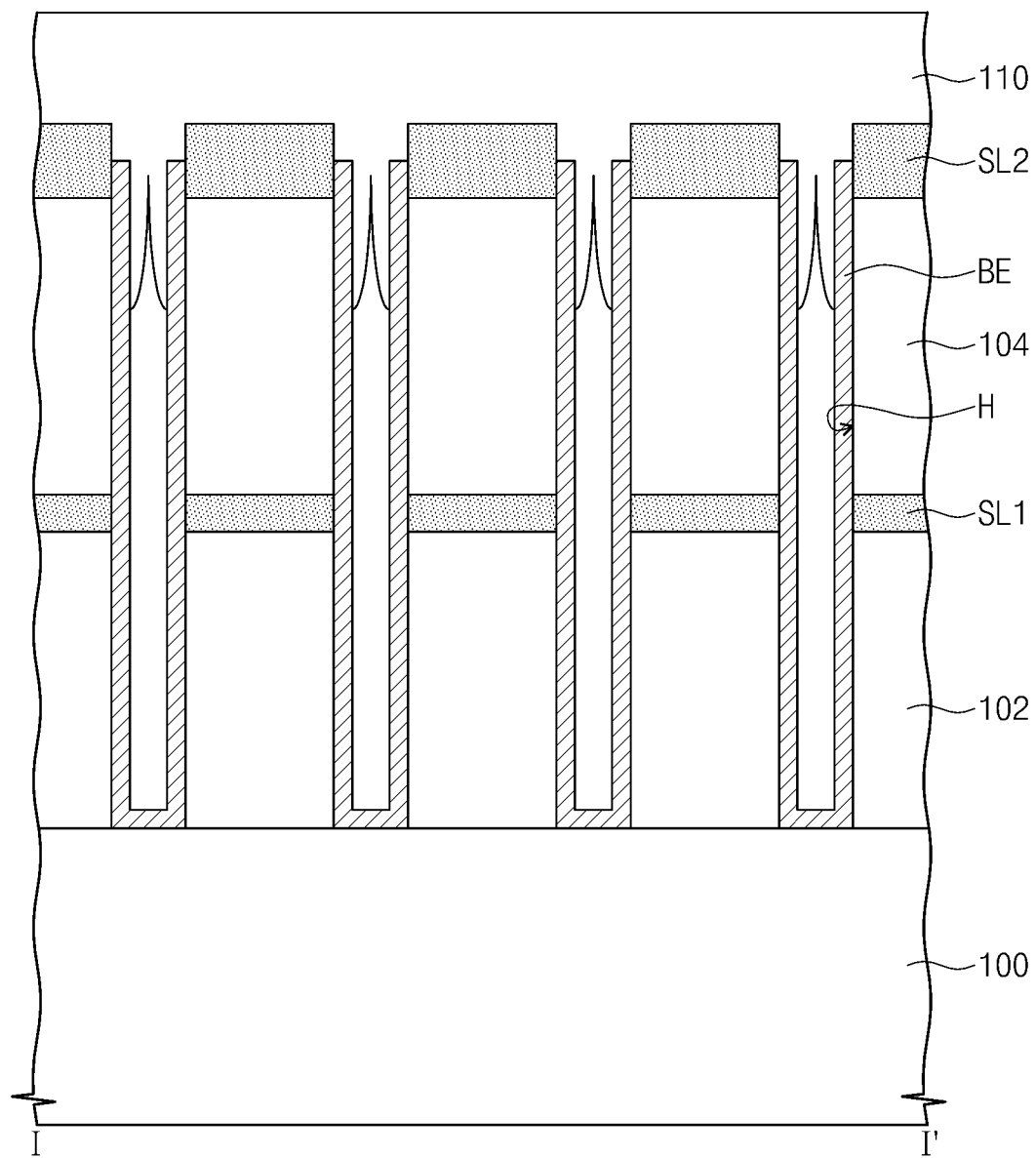
Figure 7:
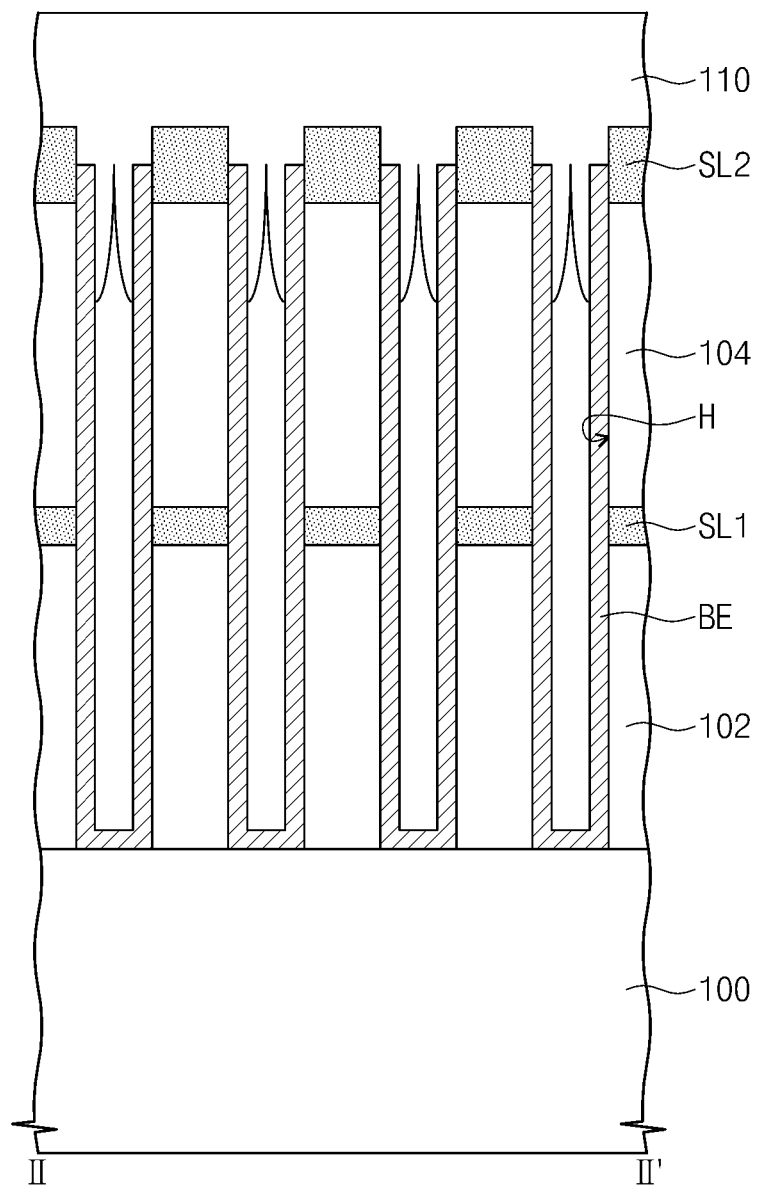

Referring to FIGS. 6 and 7, bottom electrodes BE may be formed in the holes H. The formation of the bottom electrodes BE may include planarizing the bottom electrode layer 106 until exposing the second support layer SL2. The planarization process may be, for example, an etch-back process or a chemical mechanical polishing (CMP) process. Each of the bottom electrodes BE may be locally formed in the holes H by the planarization process and may be separated from each other. In example embodiments, during the planarization process, upper surfaces of the bottom electrodes BE may be recessed below an upper surface of the second support layer SL2. Accordingly, the upper surface of each of the bottom electrodes BE may be positioned at a lower level than the upper surface of the second support layer SL2 adjacent to it. As shown in the FIGS. 6 and 7, each of the bottom electrodes BE may be formed to have a bottom-closed hollow cylinder shape. In other embodiments, each of the bottom electrodes BE may be formed to have a solid pillar shape. In other embodiments, each of the bottom electrodes BE may be formed to have a semi-pillar shape. The bottom electrode of the semi-pillar shape may include a lower portion of the solid pillar shape and an upper portion of the hollow cylinder shape.

A mask layer 110 may be formed on a resultant substance by forming the bottom electrodes BE. The mask layer 110 may be formed, for example, using a deposition technique having a poor property of step coverage. Accordingly, the mask layer 110 may partially fill an upper portion of the holes H. The mask layer 110 may be formed of a material having an etch selectivity with respect to the first and second support layers SL1 and SL2, and the first and second mold layers 102 and 104. The mask layer 110 may be, for example, a hard mask layer with carbon.

Figure 8:
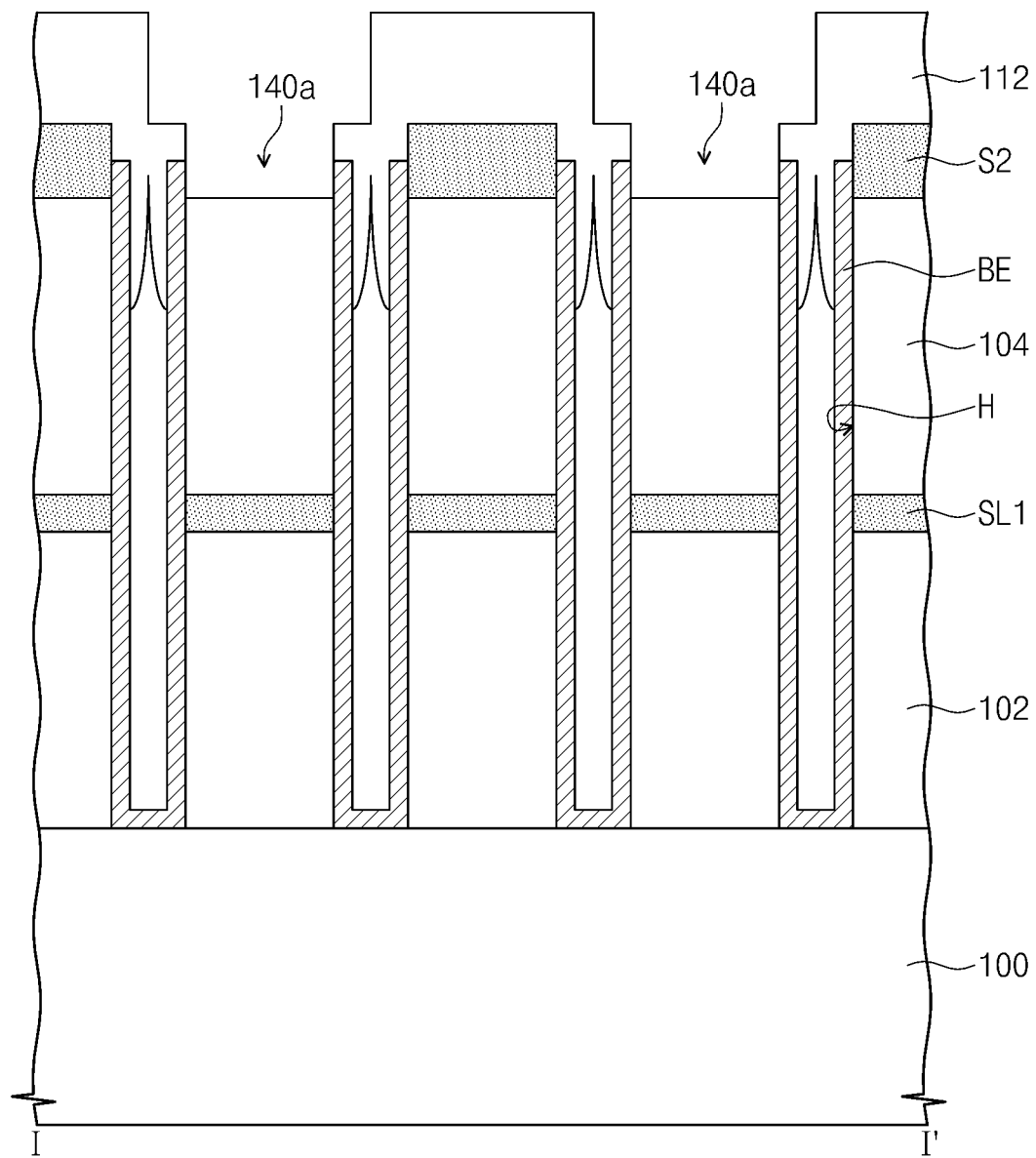
Figure 9:
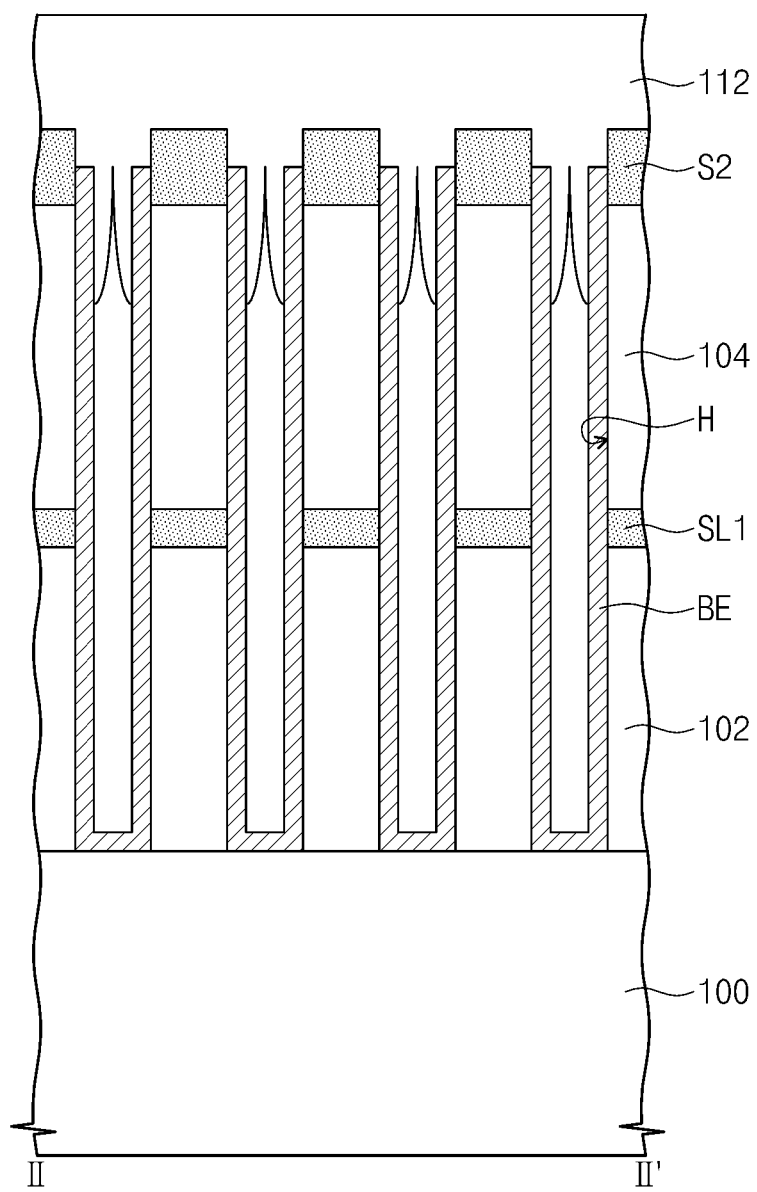

Referring to FIGS. 8 and 9, a support mask pattern 112 may be formed to have a plurality of openings exposing the second support layer SL2 by patterning the mask layer 110.

The second support layer SL2 may be etched using the support mask pattern 112 as an etch mask to form an upper support pattern S2. The support pattern S2 may have a plurality of upper openings 140a exposing an upper surface of the second mold layer 104.

Figure 10:
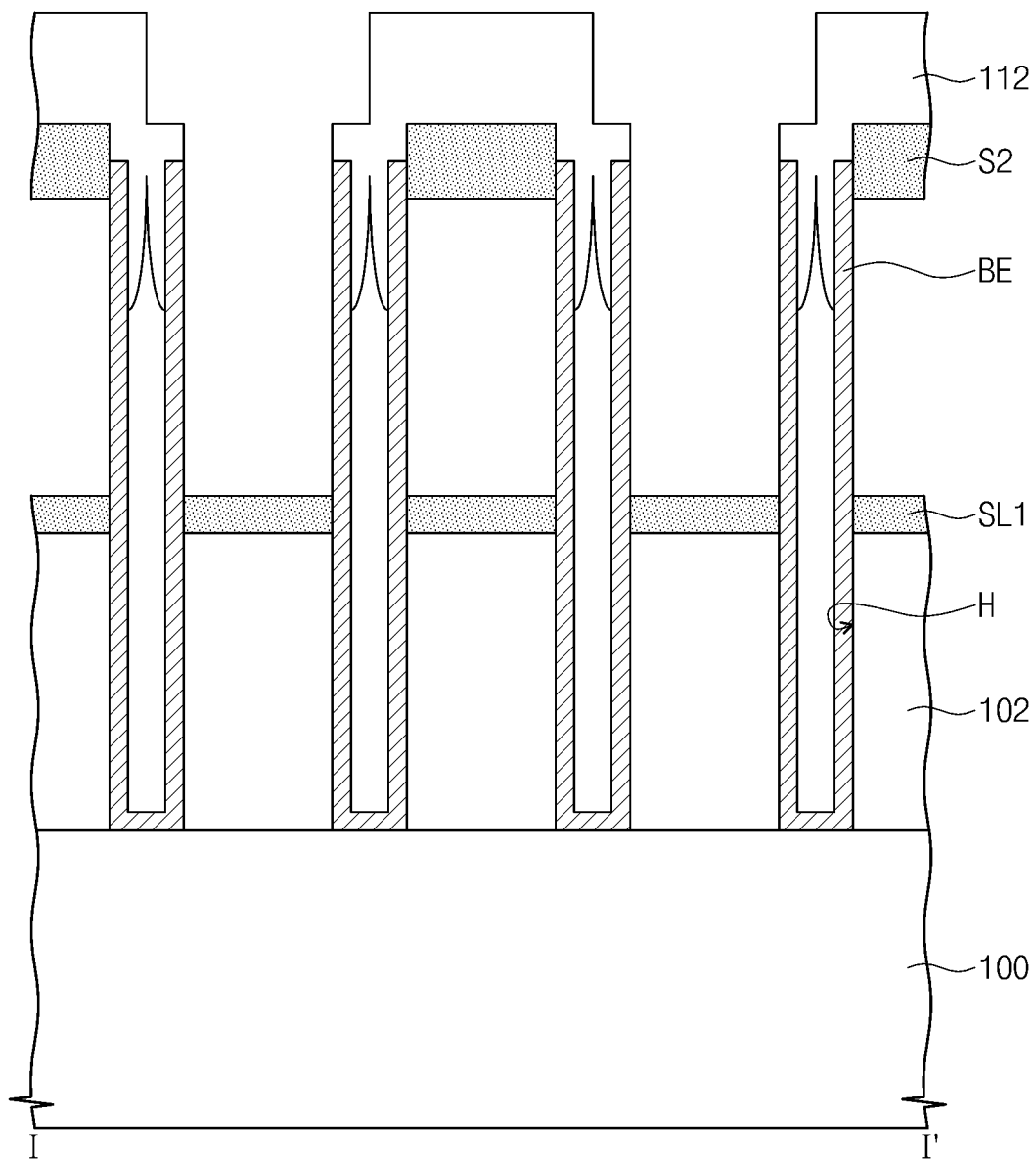
Figure 11:
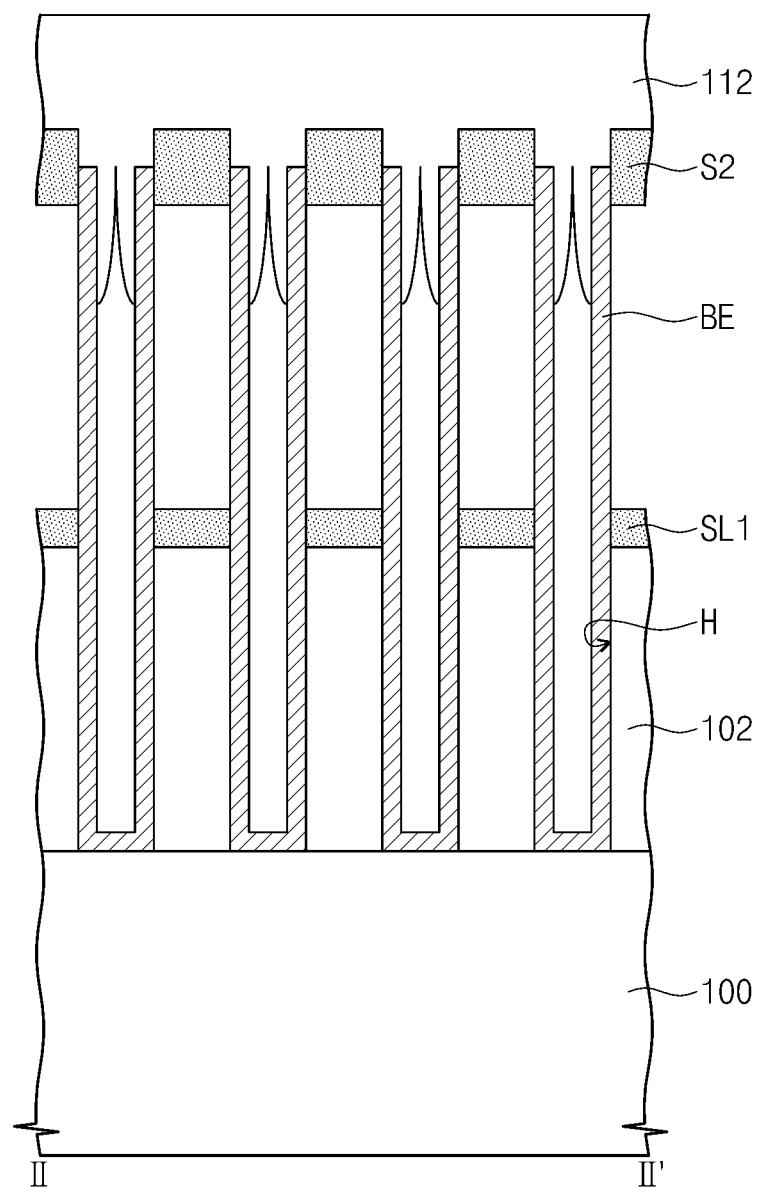

Referring to FIGS. 10 and 11, the second mold layer 104 may be removed through the plurality of upper openings 104a. The removal of the second mold layer 104 may include performing an etching process having an etch selectivity with respect to the support mask pattern 112, the upper support pattern S1 and the first support layer SL1. As an example, the second mold layer 104 may be removed by performing an isotropic etching process using phosphoric acid. An upper surface of the first support layer SL1 and the upper portion of the sidewall of each of the bottom electrodes BE may be exposed by the removal of the second mold layer 104.

Figure 12:
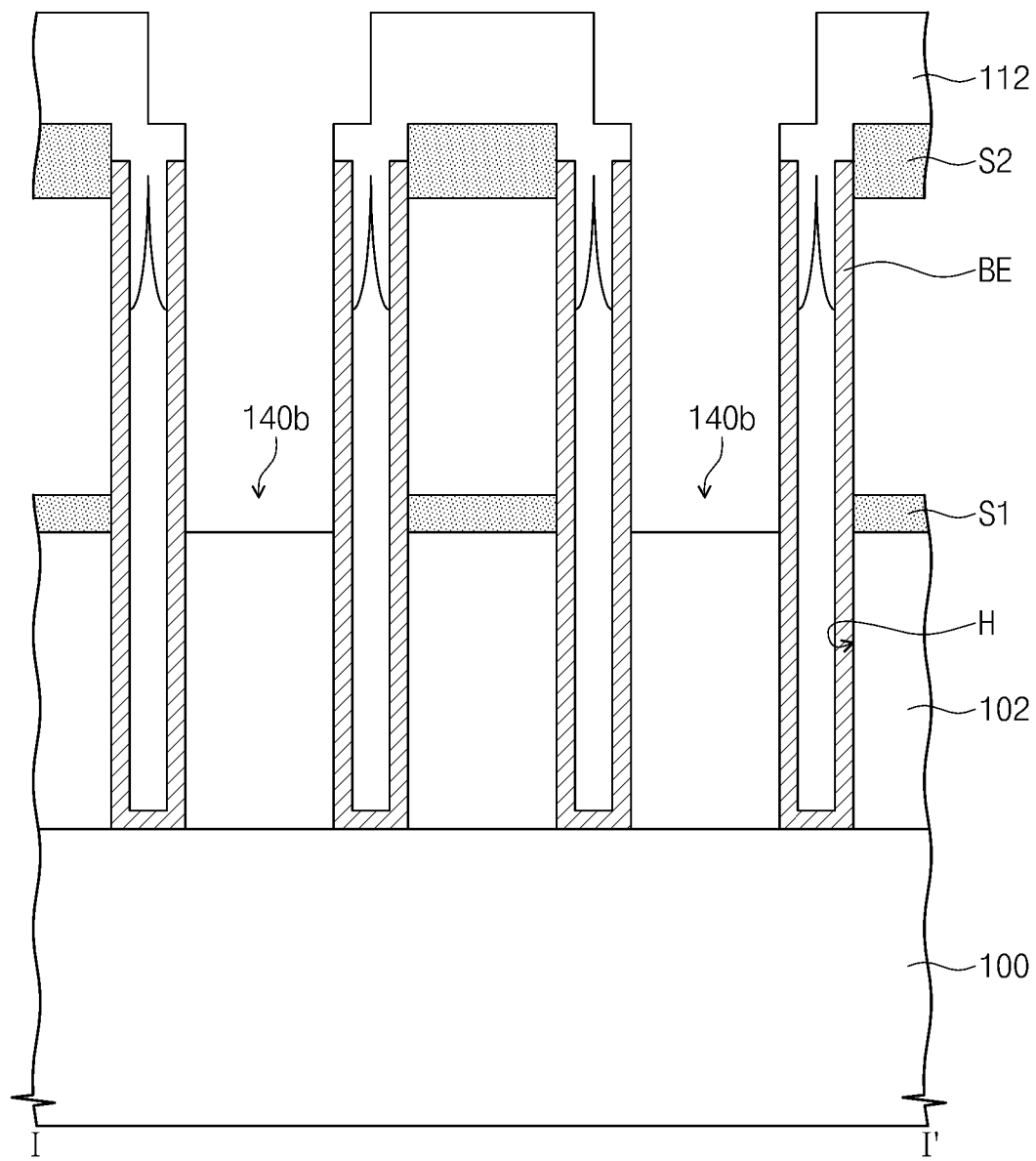
Figure 13:
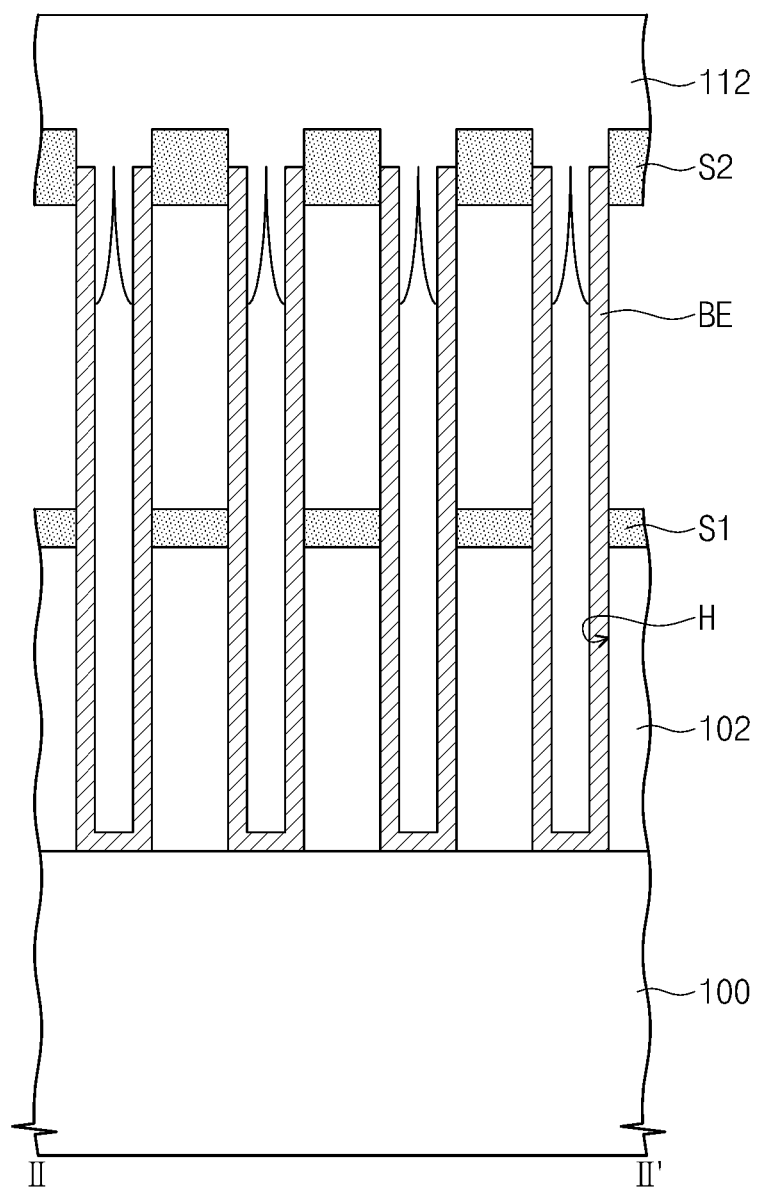

Referring to FIGS. 12 and 13, the first support layer SL1 may be etched using the support mask pattern 112 as an etch mask to form a lower support pattern S1. The lower support pattern SL1 may have a plurality of lower openings 140b exposing an upper surface of the first mold layer 102. When viewed in a plan view, each of the plurality of upper openings 140a may overlap a corresponding one of the plurality of lower openings 140b. In addition, when viewed in a plan view, the lower and upper support pattern SL1 and SL2 may overlap each other.

Figure 14:
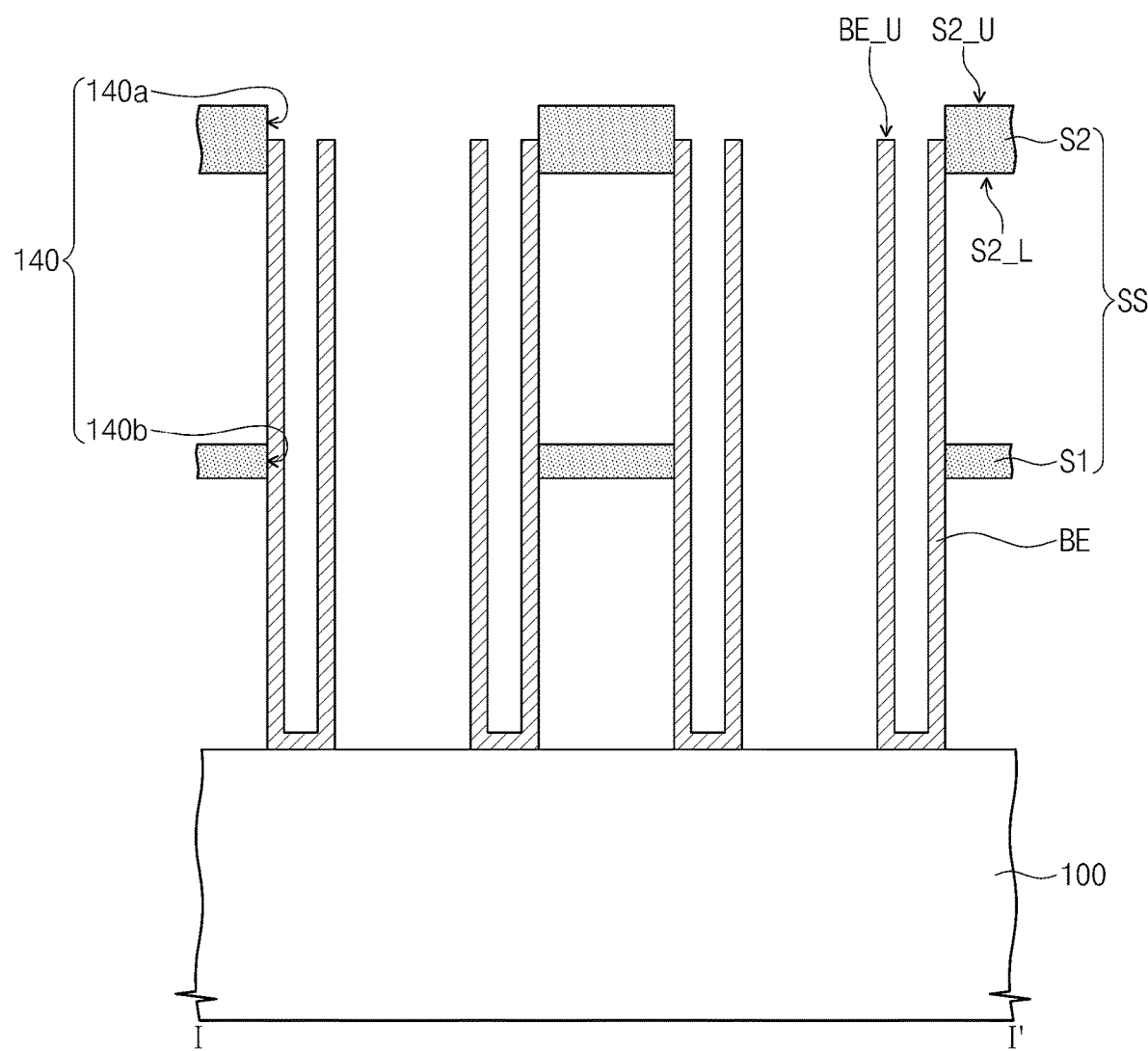
Figure 15:
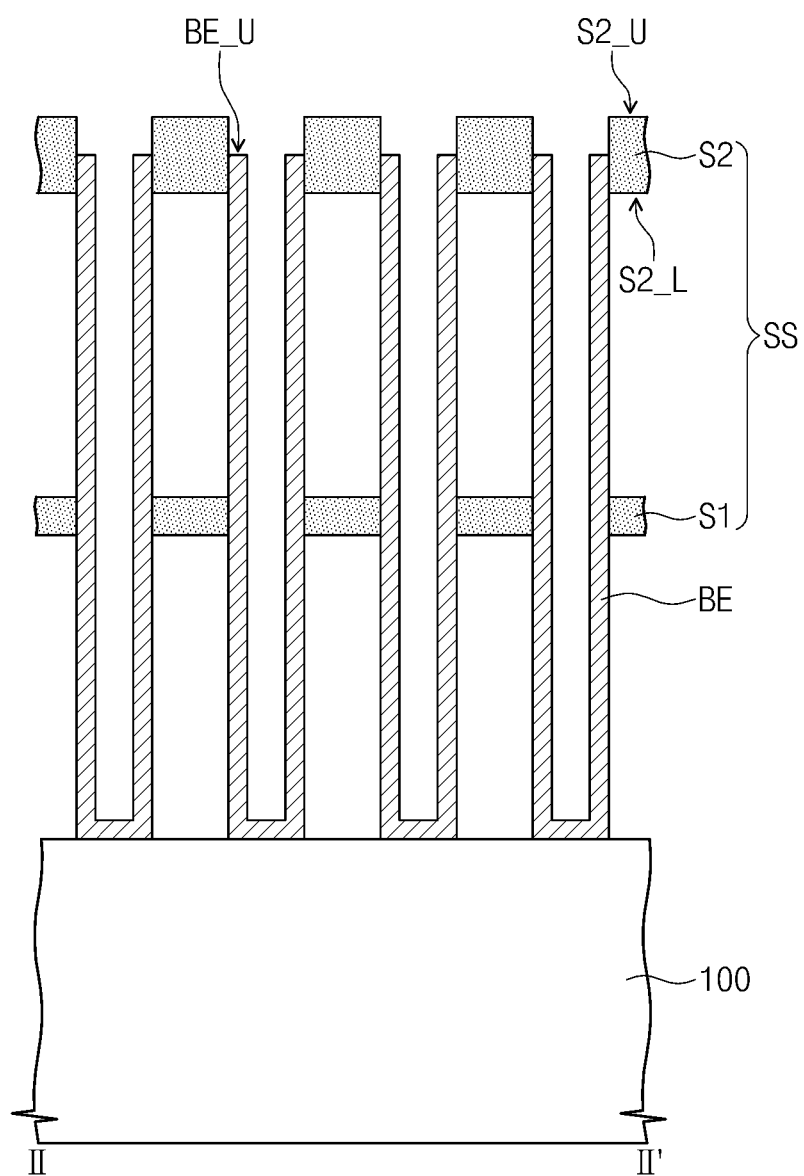

Referring to FIGS. 14 and 15, the support mask pattern 112 may be removed after forming the lower support pattern S1. The removal of the support mask pattern 112 may include, for example, performing an ashing and/or strip process. After removing the support mask pattern 112, the first mold layer 102 may be removed through the plurality of lower openings 140b. The removal of the first mold layer 102 may include an etching process having an etch selectivity with respect to the upper support pattern S2 and the lower support pattern S1. As an example, the first mold layer 102 may be removed by performing an isotropic etching process using phosphoric acid. An upper surface of the lower structure 100 and the lower portion of the sidewall of each of the bottom electrodes BE may be exposed by the removal of the first mold layer 102.

A support structure SS may be defined by the lower and upper support patterns S1 and S2. The support structure SS, as shown in the FIG. 1, may have a plurality of openings 140. The plurality of openings 140 may include the plurality of upper openings 140a of the upper support pattern S2 and the plurality of lower openings 140b of the lower support pattern S1.

Generally, in the case where the support mask pattern 112 is removed by the removal process of the second mold layer 104 before forming the lower support pattern S1, an etching process for forming the lower support pattern S1 may be performed using the upper support pattern S2 as an etch mask. In this case, an upper portion of the upper support pattern S2 may be etched during the etching process. Accordingly, if the upper support pattern S2 initially has a top surface at the same level as a top of the bottom electrodes BE, then after the etching, upper portions of the bottom electrodes BE may protrude from the upper surface of the upper support pattern S2. The protruding portions of the bottom electrodes BE may be easily bent and thereby form an electrically conducting bridge between the bottom electrodes adjacent to each other. This bridge can cause an electrical failure.

In example embodiments of the inventive concept, after removing the second mold layer 104, the support mask pattern 112 may remain and the etching process for forming the lower support pattern S1 may be performed using the support mask pattern 112 as an etch mask. Accordingly, the upper portion of the upper support pattern S2 may be prevented from being etched during the etching process. Accordingly, an upper surface S2_U of the upper support pattern S2 may be positioned at a higher level than the uppermost surface BE_U of each of the bottom electrodes BE. For example, an upper end portion of each of the bottom electrodes BE may be in contact with one sidewall of the upper support pattern S2. Accordingly, the upper end portion of each of the bottom electrodes BE may be prevented from being bent.

Referring back to FIGS. 2 and 3, a dielectric layer 150 may be formed on a resultant substance that is formed by removing the first mold layer 102, and a top electrode may be formed on the dielectric layer 150.

The dielectric layer 150 may be formed of or include at least one of metal oxides (e.g., $HfO_2$, $ZrO_2$, $Al_2O_3$, $La_2O_3$, $Ta_2O_3$ and $TiO_2$) and perovskite dielectric materials (e.g., $SrTiO_3$, $(Ba,Sr)TiO_3$, $BaTiO_3$, PZT, PLZT) and may be provided in a single-layered or multi-layered structure. The top electrode TE may include at least one of doped silicon, metal, metal nitride and metal silicide. For example, the top electrode TE may be formed of high melting point metal such as cobalt, titanium, nickel, tungsten and molybdenum. The top electrode TE may be formed of metal nitride such as titanium nitride, titanium silicon nitride, titanium aluminum nitride, tantalum nitride, tantalum silicon nitride, tantalum aluminum nitride and tungsten nitride. Furthermore, the top electrode TE may be formed of noble metal such as platinum, ruthenium and iridium. The top electrode TE may be formed of noble conductive metal oxide such as platinum oxide, ruthenium oxide and iridium oxide. The top electrode TE may be formed of conductive oxide such as SRO ($SrRuO_3$), BSRO(($Ba,Sr)RuO_3$), CRO($CaRuO_3$) and LSCo.

The dielectric layer 150 and the top electrode TE may be formed using deposition techniques having an excellent property of step coverage such as a chemical vapor deposition (CVD), a physical vapor deposition (PVD) or an atomic layer deposition (ALD).

Figure 16:
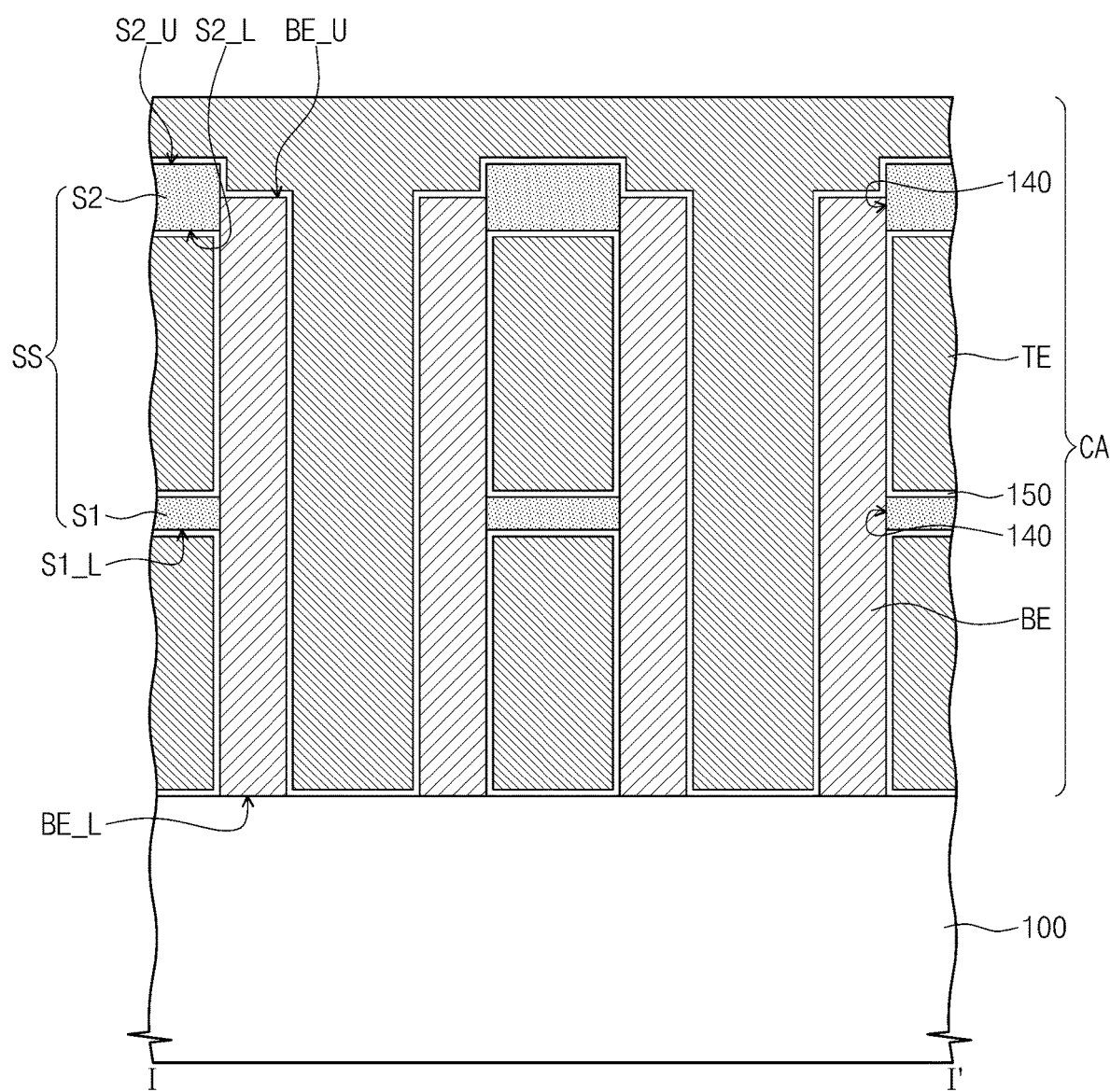
FIGS. 16 and 17 are cross-sectional views taken along lines I-I' and II-II' of the FIG. 1, respectively to illustrate a capacitor structure of a semiconductor device according to other embodiments of the inventive concept.
Figure 17:
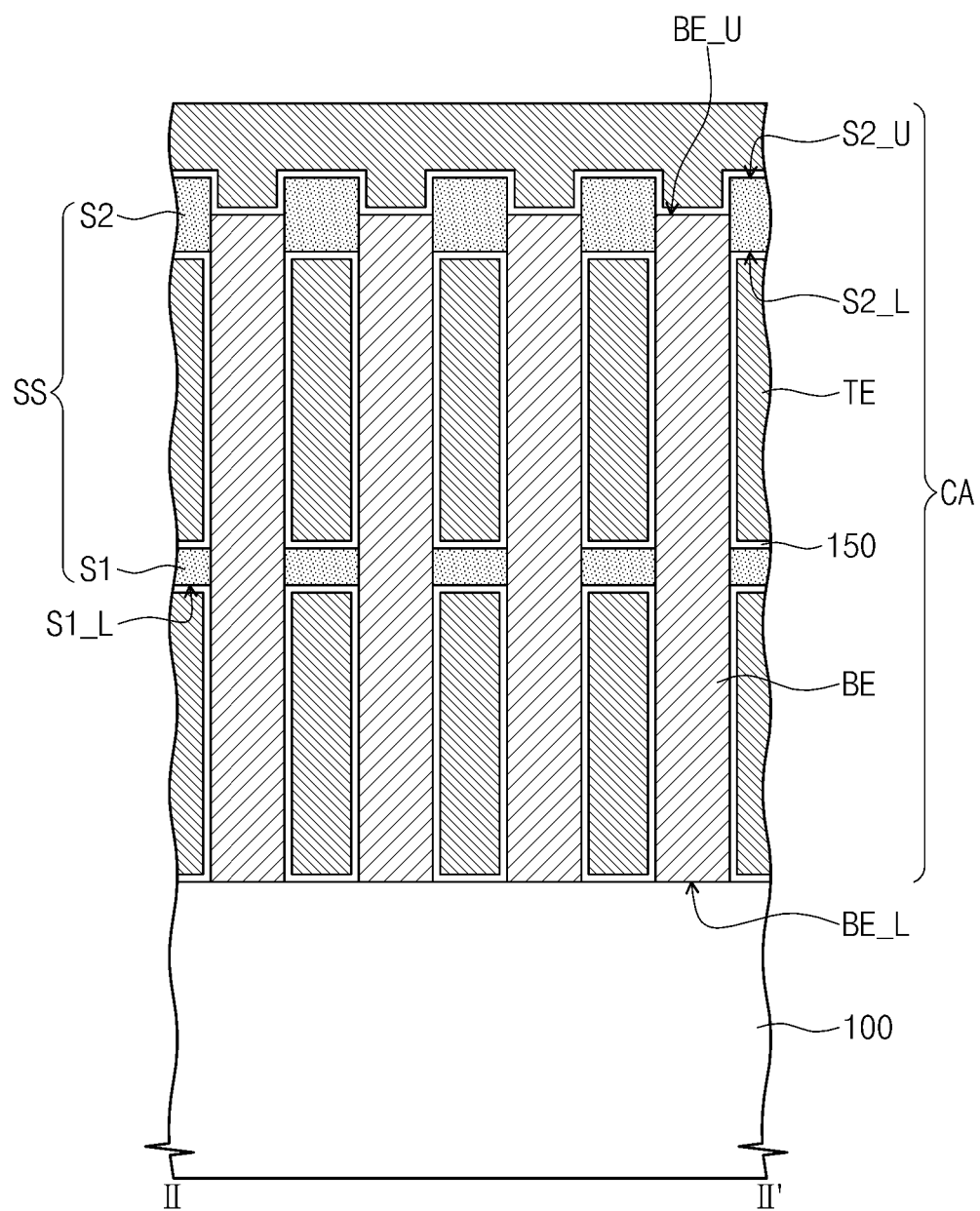

FIGS. 16 and 17 are cross-sectional views taken along lines I-I' and II-II' of the FIG. 1, respectively, to illustrate a capacitor structure of a semiconductor device according to other embodiments of the inventive concept.

In example embodiments, each of the bottom electrodes BE may be pillar-shaped. In case where the bottom electrodes BE are provided with the pillar shape, the top electrode TE may cover the upper surface S2_U and the upper portion of the sidewall of the upper support pattern S2 and may extend on an upper surface BE_U and an outer sidewall of each of the bottom electrodes BE.

Figure 18:
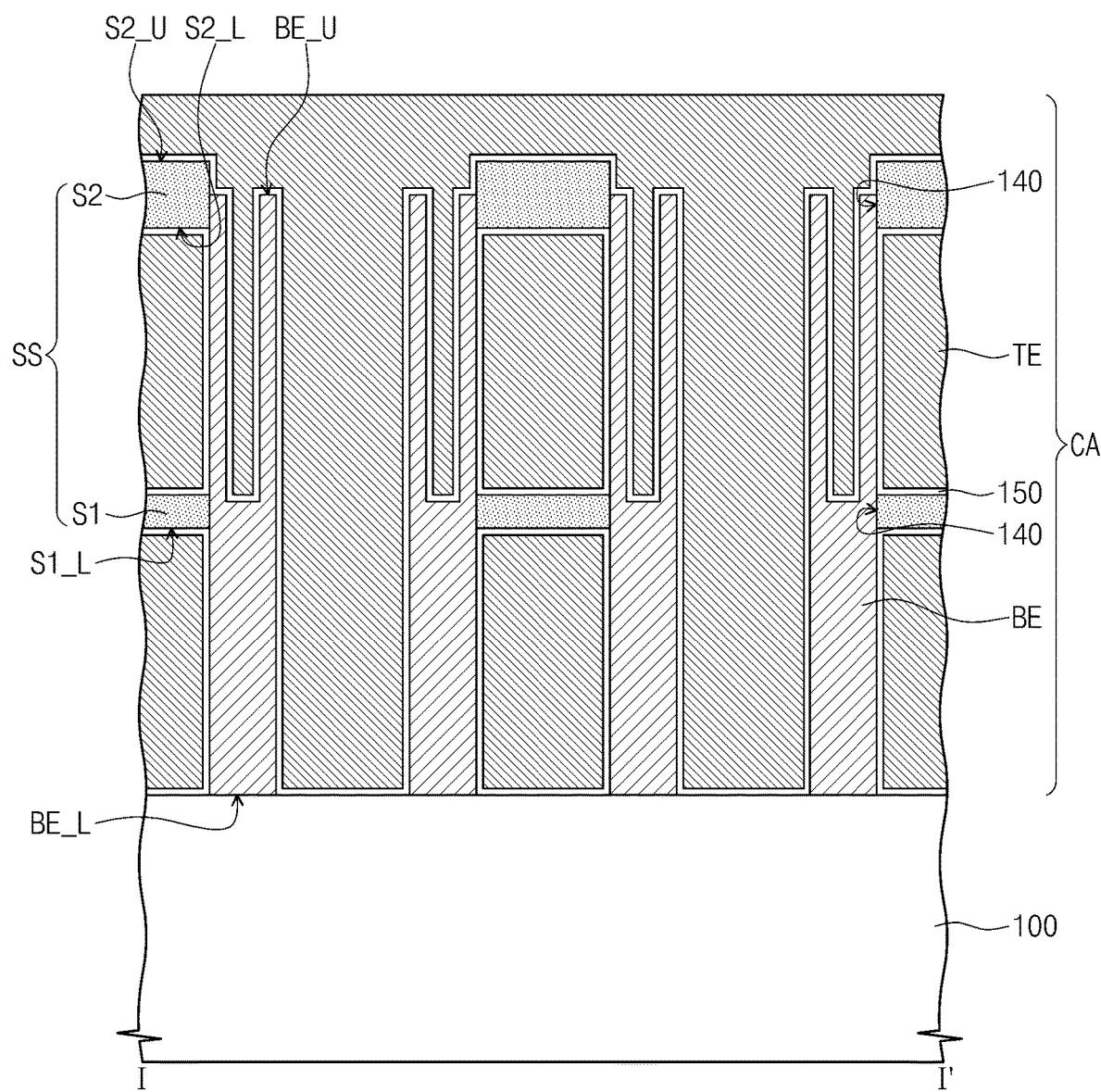
FIGS. 18 and 19 are cross-sectional views taken along lines I-I' and II-II' of the FIG. 1, respectively to illustrate a capacitor structure of a semiconductor device according to certain embodiments of the inventive concept.
Figure 19:
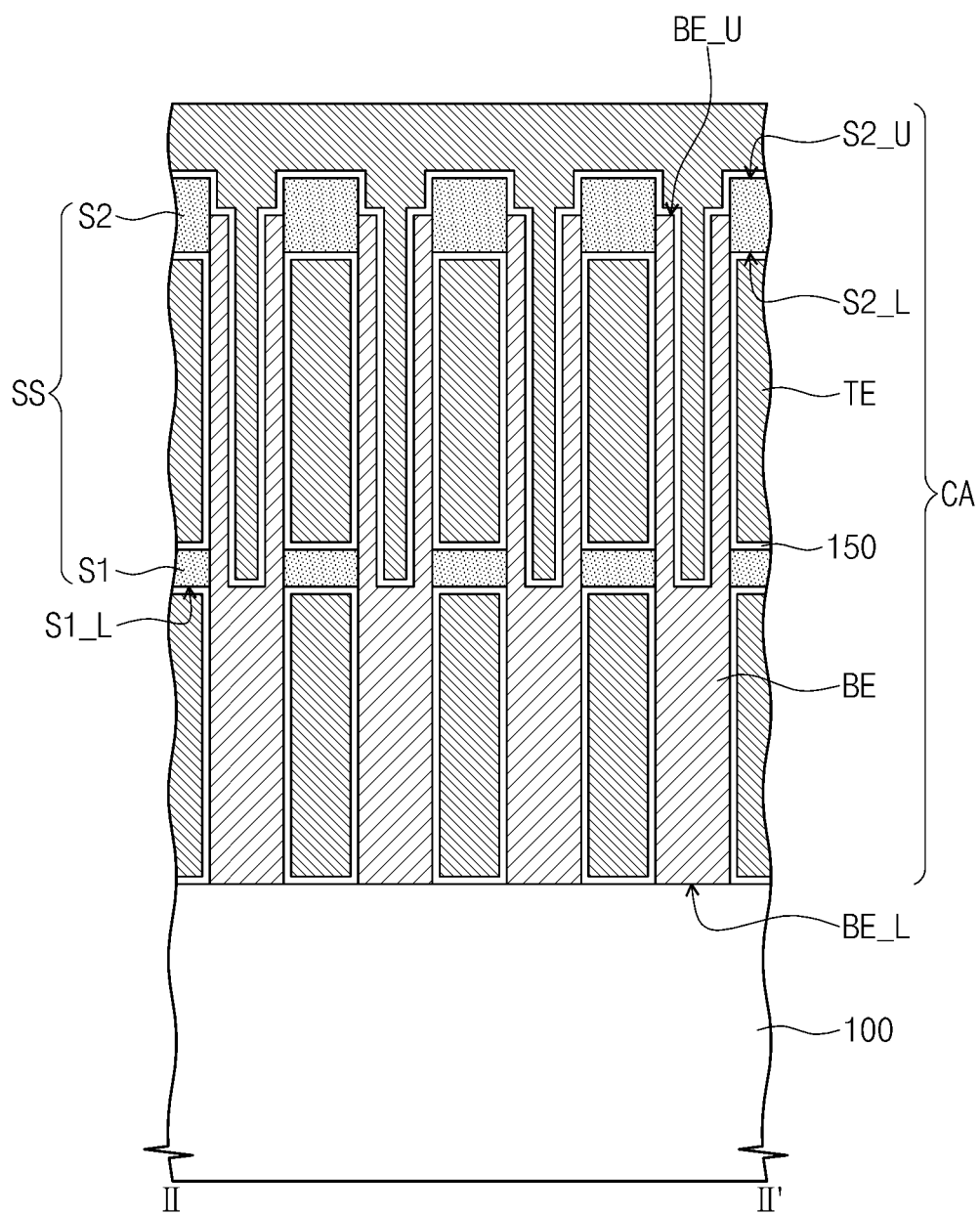

FIGS. 18 and 19 are cross-sectional views taken along lines I-I' and II-II' of the FIG. 1, respectively, to illustrate a capacitor structure of a semiconductor device according to other embodiments of the inventive concept.

In example embodiments, each of the bottom electrodes BE may be shaped like a semi-pillar. For example, each of the bottom electrodes BE may include a pillar-shaped lower portion and a hollow cylinder-shaped upper portion. In case where the bottom electrodes BE are provided with the semi-pillar shape, the upper portion of each of the bottom electrodes BE may have inner and outer sidewalls corresponding to each other. In this case, the top electrode TE may cover the outer sidewall of the upper portion of each of the bottom electrodes BE, and may extend on the inner sidewall of the upper portion of each of the bottom electrodes BE. In addition, the top electrode TE may cover the outer sidewall of the lower portion of each of the bottom electrodes BE.

The shape of the capacitor structure according to an example embodiment of the inventive concept is not limited to FIG. 1, and can be modified in a variety of forms, such as shown in FIGS. 20 to 23 that will be described below.

Figure 20:
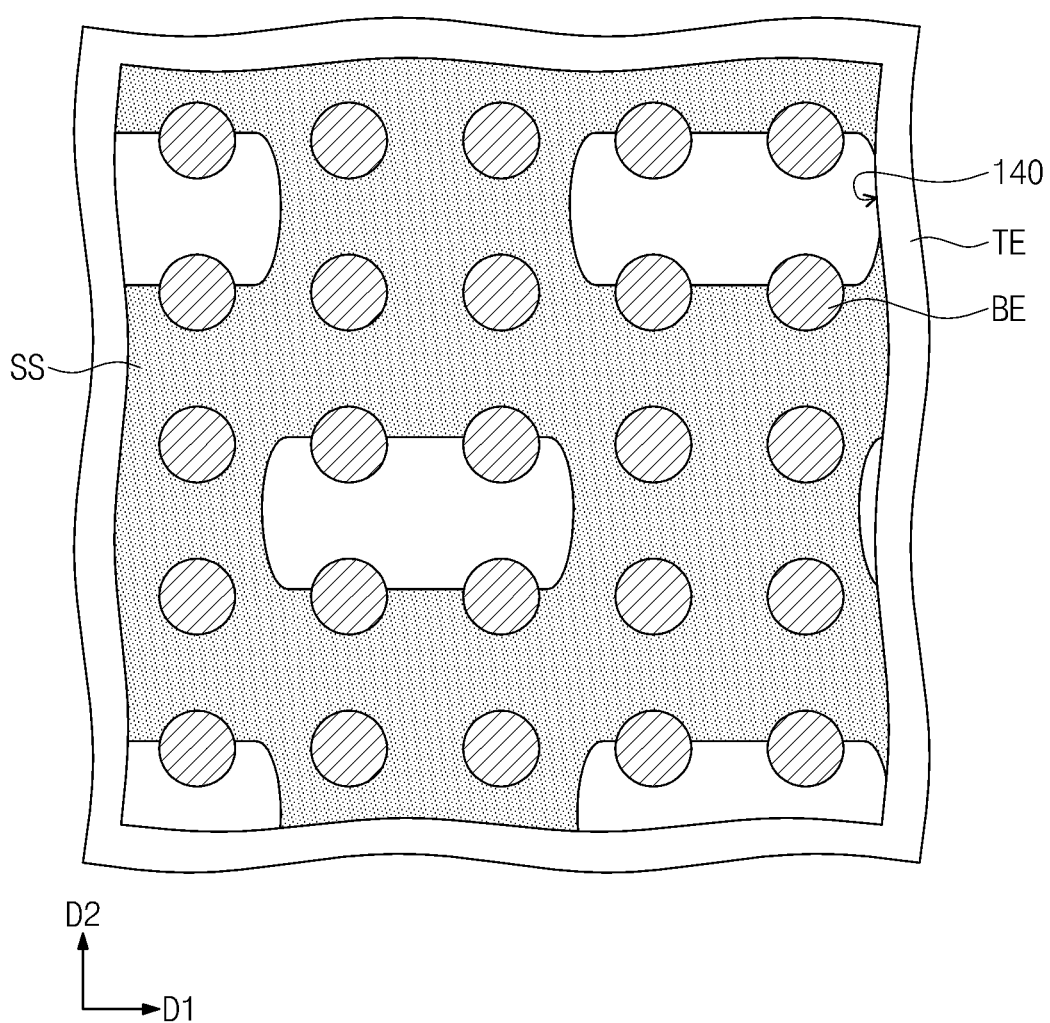
FIGS. 20 to 23 are plan views illustrating a capacitor structure of a semiconductor device according to certain embodiments of the inventive concept.

FIGS. 20 to 23 are plan views illustrating a capacitor structure of a semiconductor device according to other embodiments of the inventive concept. Referring to FIG. 20, the capacitor structure CA-1 may include a support structure SS with a plurality of openings 140 each exposing four bottom electrodes BE. When viewed in a plan view, the plurality of openings 140 may be spaced apart from each other in a first direction D1 and a second direction D2 with four bottom electrodes BE interposed between adjacent openings 140 the plurality of openings 140. When viewed in a plan view, a outer boundary of at least one of the plurality of openings 140 may is round shaped.

Figure 21:
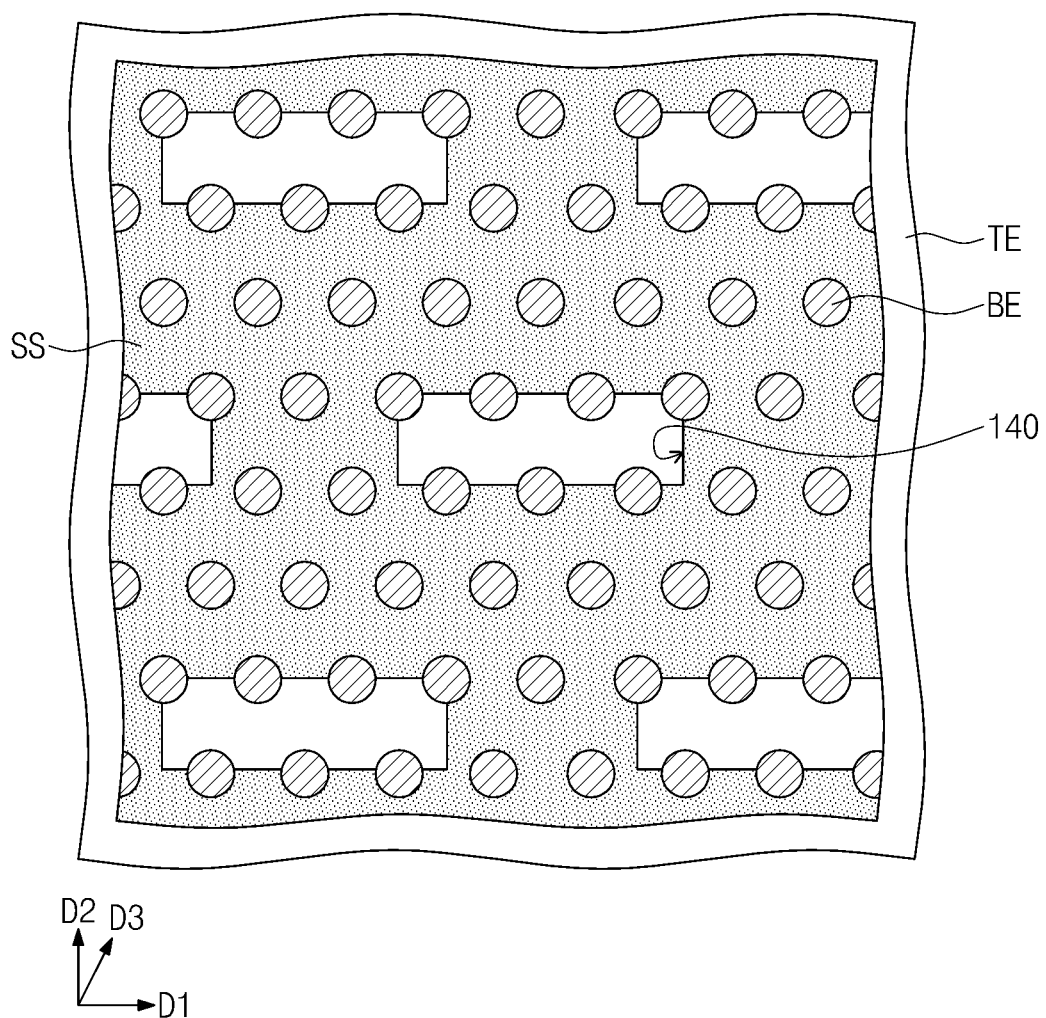
Figure 22:
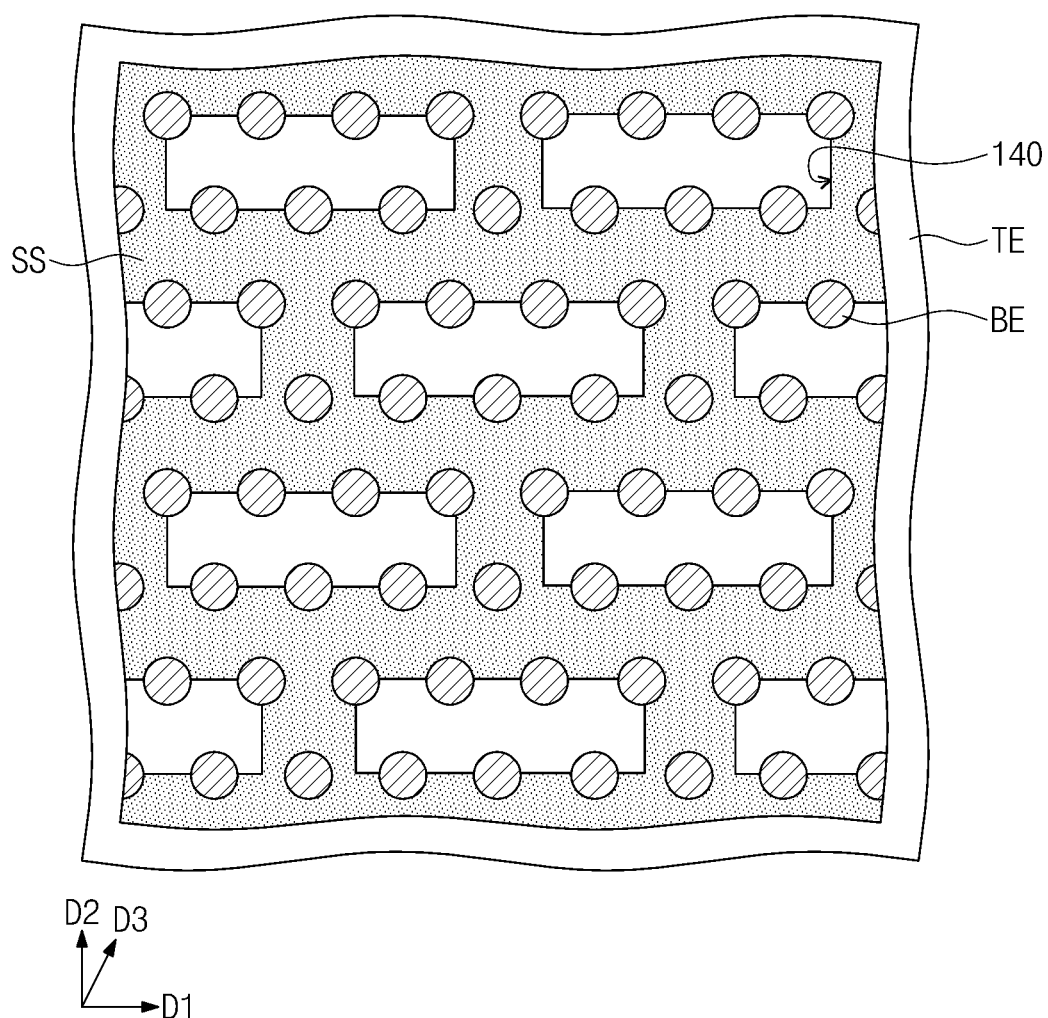
Figure 23:
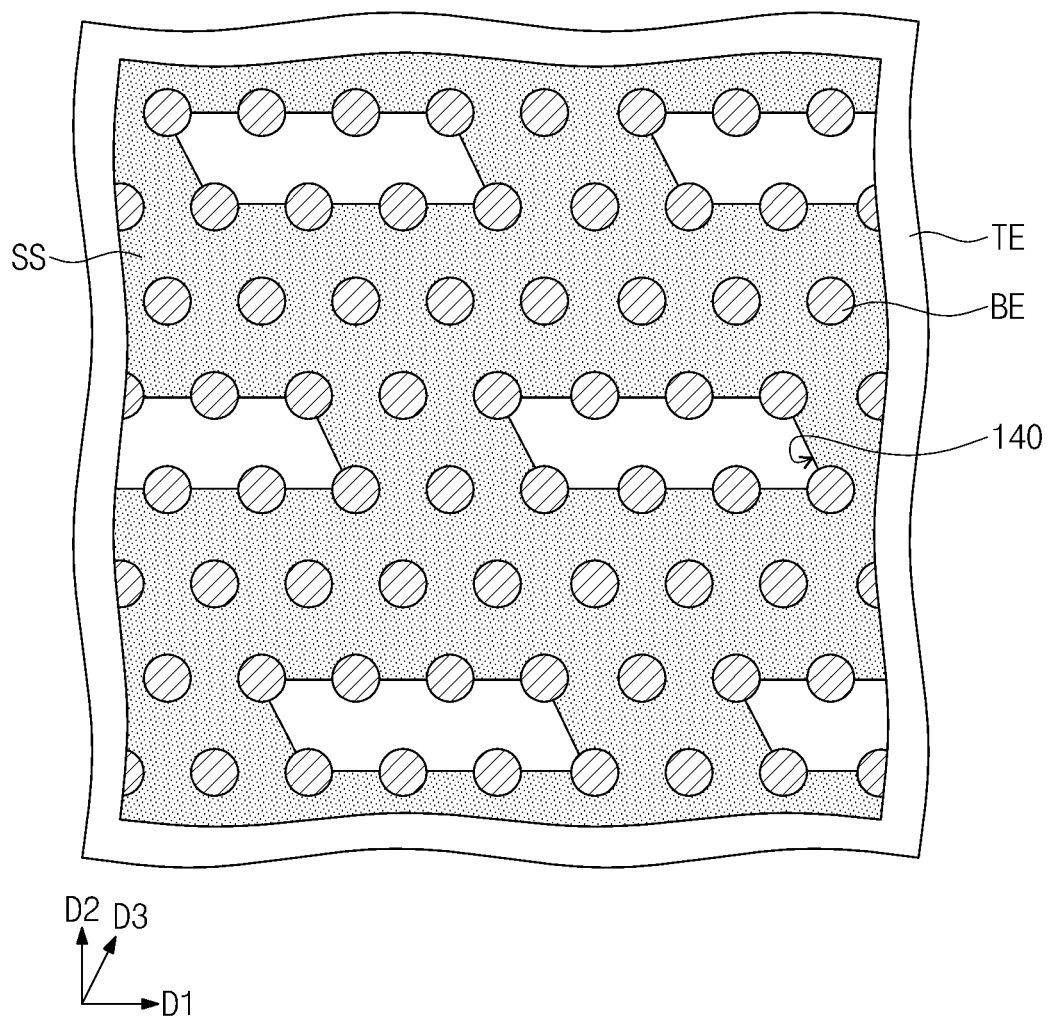

Referring to FIGS. 21 to 23, the bottom electrodes BE arranged in a third direction D3 may form a row, or line. The third direction D3 may cross both the first and second directions D1 and D2. The bottom electrodes BE arranged in the first direction D1 may form a row. Rows adjacent to each other may be arranged to be offset in the first direction D1.

When viewed in a plan view, the plurality of openings 140 of capacitor structures CA-2 and CA-3 shown in the FIGS. 21 and 22 may be rectangle-shaped. Each of the plurality of openings 140 may expose an odd number of (e.g., seven)

bottom electrodes BE. The plurality of openings 140 may be spaced apart from each other by one row of bottom electrodes BE that is not exposed by the plurality of openings 140 as shown in the FIG. 21. Alternatively, the bottom electrodes BE may not be interposed between the plurality of openings 140. When viewed in a plan view, the shape of opening 140 is not limited to the rectangle and may have a shape such as polygon, circle, oval shape or a parallelogram having acute and obtuse angles to have sides that are not perpendicular to each other, as shown in the FIG. 23 (this may be a rhombus shape in some cases).

Figure 24:
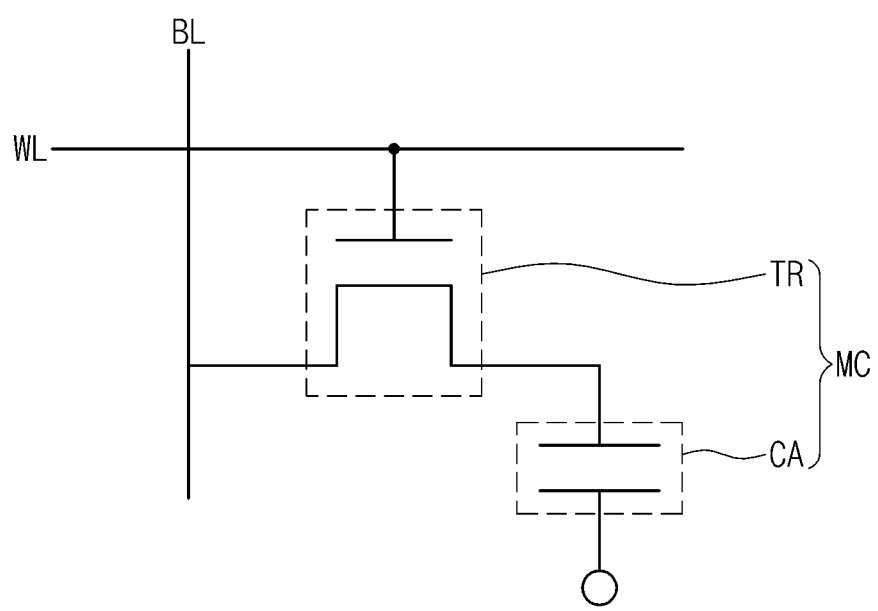
FIG. 24 is a circuit diagram schematically showing an unit memory cell of a semiconductor device including a capacitor structure according to example embodiments of the inventive concept.

FIG. 24 is a circuit diagram schematically showing a unit memory cell of a semiconductor device including a capacitor structure according to example embodiments of the inventive concept.

As used herein, a semiconductor device may refer to any of the various devices such as shown in FIGS. 1-26, and may also refer, for example, to one or more transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

Referring to FIG. 24, a memory cell MC may be connected with a word line WL and a bit line BL crossing each other. The memory cell MC may be disposed between the word line WL and the bit line BL. The memory cell MC may include a transistor TR connected with the word line WL and a capacitor structure CA connected with the transistor TR. A drain region of the transistor TR may be connected with the bit line BL and a source region of the transistor TR may be connected with the capacitor structure CA. The transistor may selectively control a flow of charge between a source region and the capacitor structure CA. The memory cell MC may store data of 0 or 1 depending on whether the charge is stored in the capacitor structure CA. The capacitor structure CA may be formed by and have the structure such as discussed above in connection with FIGS. 1-23.

Figure 25:
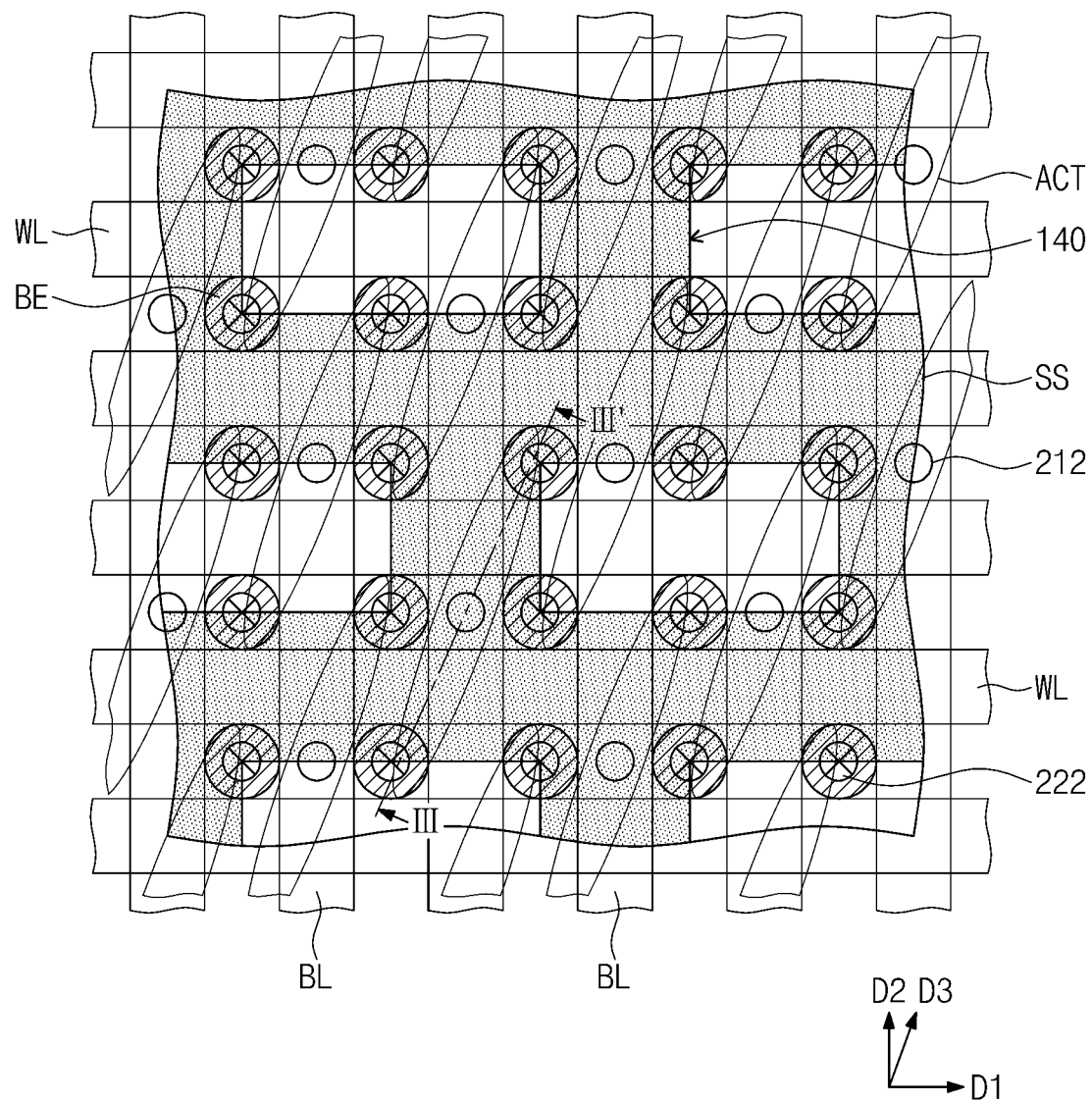
FIG. 25 is a plan view illustrating a semiconductor device including a capacitor structure according to example embodiments of the inventive concept.
Figure 26:
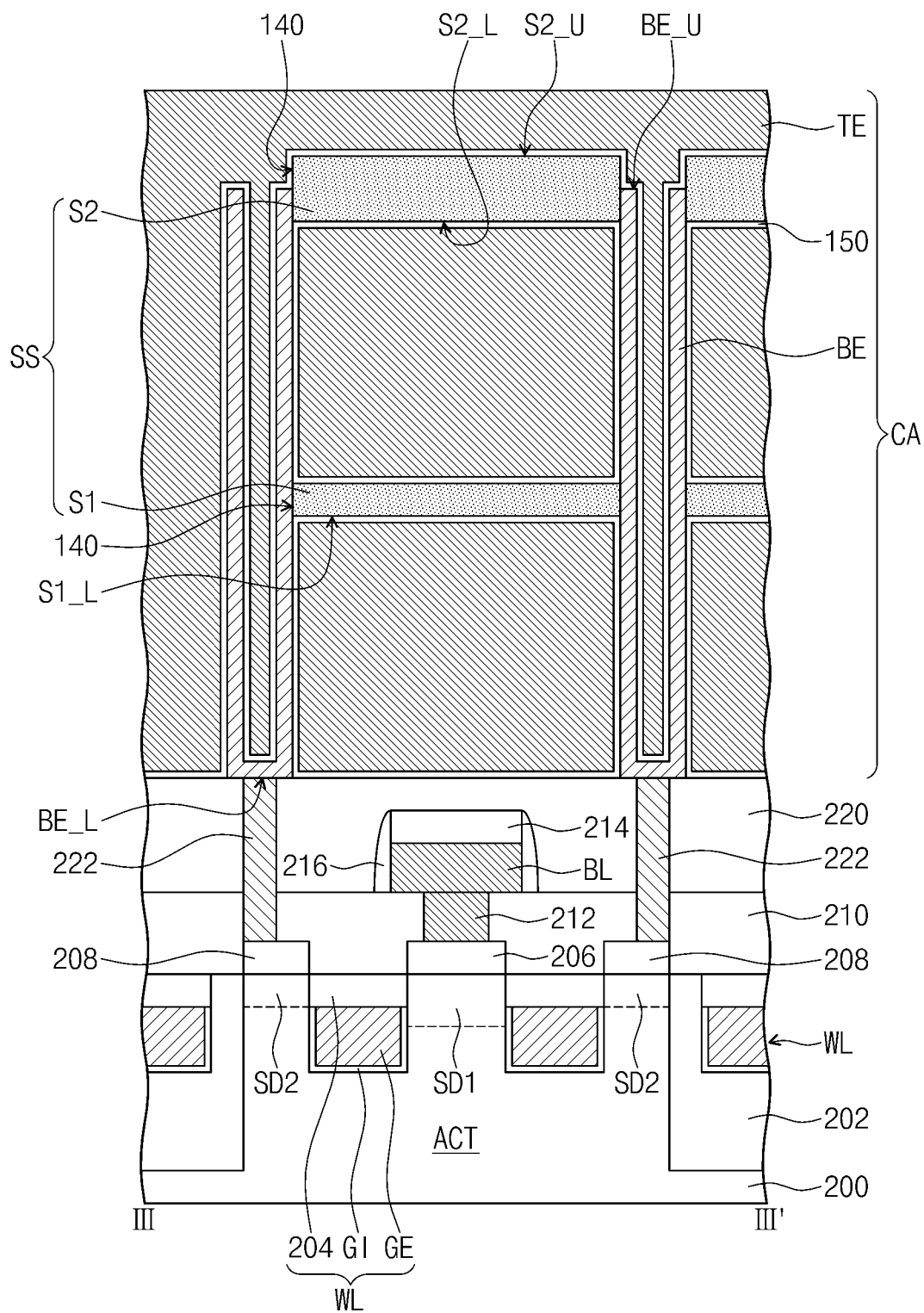
FIG. 26 is an exemplary cross-sectional view taken along line III-III' of the FIG. 25.

FIG. 25 is a plan view illustrating a semiconductor device including a capacitor structure according to example embodiments of the inventive concept. FIG. 26 is a cross-sectional view taken along line III-III' of the FIG. 25.

Referring to FIGS. 25 and 26, a device isolation layer 202 may be provided on the substrate 200 to define active regions ACT. The substrate 200 may be a semiconductor substrate (e.g., a silicon substrate, a germanium substrate or a silicon-germanium substrate). The device isolation layer 202 may be formed of or include, for example, a silicon oxide layer, a silicon nitride layer and/or a silicon oxynitride layer. In a plan view, each of the active regions ACT may be shaped like a bar, of which longitudinal axis is parallel to a third direction D3 or is at an angle to first and second directions D1 and D2 crossing each other.

A word line WL may be provided in the substrate 200 to cross the active regions ACT. The word lines WL may extend in the first direction D1 and may be arranged in the second direction D2. Each of the word lines WL may include a gate electrode GE, a gate insulating pattern GI, and a gate capping pattern 204. The gate electrode GE may be buried in the substrate 200. The gate insulating pattern GI may be interposed between the gate electrode GE and the active regions ACT and between the gate electrode GE and the device isolation layer 202. The gate capping pattern 204 may be disposed on an upper surface of the gate electrode GE. An upper surface of the gate capping pattern 204 may be substantially coplanar with that of the substrate 200. In example embodiments, the gate capping pattern 204 may have a lower surface in contact with an upper surface of the gate insulating pattern GI and both sidewalls in contact with the active regions ACT and/or the device isolation layer 202. In other embodiments, the gate insulating pattern GI may include portions extending between the gate capping pattern 204 and the active regions ACT and/or between the gate capping pattern 204 and the device isolation layer 202.

The gate electrode GE may include a conductive material. As an example, the conductive material may include at least one of doped semiconductor materials (e.g., doped silicon, doped germanium, and so on), conductive metal nitrides (e.g., titanium nitride, tantalum nitride, and so on), metals (e.g., tungsten, titanium, tantalum, and so on) and metal-semiconductor compounds (e.g., tungsten silicide, cobalt silicide, titanium silicide, and so on). The gate insulating pattern GI may include, for example, a silicon oxide layer, a silicon nitride layer and/or a silicon oxynitride layer. The gate capping pattern 204 may include, for example, a silicon oxide layer, a silicon nitride layer and/or a silicon oxynitride layer.

A first impurity region SD1 and second impurity regions SD2 may be provided in each of the active regions ACT, and here, the second impurity regions may be spaced apart from each other with the first impurity region disposed therebetween. The first impurity region SD1 may be provided in a portion of the active region ACT that is positioned between an adjacent pair of word lines WL. Each of the second impurity regions SD2 may be provided in portions of the active region ACT that is positioned in one side of each of the pair of word lines WL. For example, the second impurity regions SD2 may be spaced apart from each other with the pair of the word lines WL interposed therebetween. The first impurity region SD1 may have a depth greater than that of the second impurity regions SD2, when measured from the upper surface of the substrate 200. The first impurity region SD1 may have the same conductive type as the second impurity region SD2.

A first pad 206 and a second pad 208 may be provided on the substrate 200. The first pad 206 may be connected to the first impurity region SD1, and the second pads 208 may be connected to the second impurity regions SD2. The first and second pads 206 and 208 may include a conductive layer (e.g., a doped polycrystalline silicon layer and/or a doped single crystalline silicon layer). A first interlayer insulating layer 210 may be provided on the substrate 200 to cover the first and second pads 206 and 208. The first interlayer insulating layer 210 may include a silicon oxide layer, a silicon nitride layer and/or a silicon oxynitride layer.

Bit lines BL may be provided on the first interlayer insulating layer 210. The bit lines BL may extend in the second direction D2 and may be arranged in the first direction D1. Each of the bit lines BL may be electrically connected to the first impurity region SD1 through a bit line contact 212 and the first pad 206. The bit line contact may penetrate the first interlayer insulating layer 210 and may be connected to the first pad 206. The bit lines BL may include at least one of, for example, doped semiconductor materials (e.g., doped silicon, doped germanium, and so on), conductive metal nitrides (e.g., titanium nitride, tantalum nitride, and so on), metals (e.g., tungsten, titanium, tantalum, and so on) and meta-semiconductor compounds (e.g., tungsten silicide, cobalt silicide, titanium silicide and so on). The bit line contact 212 may have the same material as the bit lines BL.

A bit line capping pattern 214 may be provided on an upper surface of the bit line BL. The bit line capping pattern 214 may include, for example, a silicon nitride layer, a silicon oxide layer and/or a silicon oxynitride layer. Bit line spacers 216 may be provided on opposite sidewalls of the bit line BL. The bit line spacers 216 may include, for example, a silicon nitride layer, a silicon oxide layer and/or a silicon oxynitride layer.

A second interlayer insulating layer 220 may be provided on the first interlayer insulating layer 210 to cover the bit lines BL, the bit line capping patterns 214 and the bit line spacers 216. The second interlayer insulating layer 220 may include, for example, a silicon oxide layer.

Buried contacts 222 may be provided on the substrate 200 to penetrate the first and second interlayer insulating layers 210 and 220, and may be in contact with the second pads, respectively. The buried contacts 222 may include a conductive material (e.g., doped silicon or a metal).

A capacitor structure CA may be provided on the second interlayer insulating layer 220 to be electrically connected to the second impurity regions SD2. The capacitor structure CA may include bottom electrodes BE, which are provided on the second interlayer insulating layer 220 and are connected to the buried contacts 222, respectively. The bottom electrodes BE may be electrically connected to the second impurity regions SD2 through the buried contacts 222, respectively. The bottom electrodes BE may be cup-shaped, but example embodiments of the inventive concept are not limited thereto. As shown FIGS. 16 to 19, the bottom electrodes BE may have a variety of shapes. When viewed in a plan view, the bottom electrodes BE may be two-dimensionally arranged on the substrate 200. The capacitor structure CA may include a support structure SS that structurally supports the bottom electrodes BE. The support structure SS may include a lower support pattern S1 and an upper support pattern S2, which are vertically spaced apart from each other. The lower support pattern S1 may be provided between the second interlayer insulating layer 220 and the upper support pattern S2. The lower support pattern S1 may be in contact with the lower portion of the sidewall of each of the bottom electrodes BE, and the upper support pattern S2 may be in contact with the upper portion of the sidewall of each of the bottom electrodes BE.

Each of the lower and upper support patterns S1 and S2 may include a plurality of openings 140. When viewed in a plan view, each of the plurality of openings 140 of the upper support pattern S2 may overlap with a corresponding one of the plurality of openings 140 of the lower support pattern S1. Each of the plurality of openings 140 may have an outer boundary corresponding with at least one or more bottom electrodes BE. Each of the plurality of openings 140 may expose at least one or more bottom electrodes BE.

Each of the bottom electrodes BE may vertically extend through the lower support pattern S1. A lowest surface BE_L of each of the bottom electrodes BE may be positioned at a lower level than a lower surface S1_L of the lower support pattern S1. At least one or more bottom electrodes BE may penetrate the lower support pattern S1 and may be in contact with the inner sidewall of a corresponding one of the plurality of openings 140 of the lower support pattern S1.

Each of the bottom electrodes BE may partially penetrate the upper support pattern S2. Each of the bottom electrodes BE may be in contact with a lower portion of a sidewall of the upper support pattern S2, and may allow an upper portion of the sidewall of the upper support pattern S2 to remain exposed. Accordingly, an upper surface S2_U of the upper support pattern S2 may be positioned at a higher level than an uppermost surface BE_U of each of the bottom electrodes BE, and a lower surface S2_L of the upper support pattern S2 may be positioned at a lower level than the uppermost surface BE_U of each of the bottom electrodes BE. The uppermost surface BE_U of each of the bottom electrodes BE may be located between the upper surface S2_U and the lower surface S2_L of the upper support pattern S2. At least one or more bottom electrodes BE may be exposed at a lower portion of a corresponding one of the plurality of openings 140, and may be exposed at an upper portion of the openings 140 as well.

The capacitor structure CA may include the top electrode TE surrounding the support structure SS and the bottom electrodes BE. The bottom electrodes BE may be inserted in the top electrode TE, and the top electrode TE may cover the upper surface and sidewalls of the bottom electrodes BE. The support structure SS may be provided in the top electrode TE to contact the sidewalls of the bottom electrodes BE. The support structure SS may be provided in a form embedded in the top electrode TE. As an example, the top electrode TE may include horizontal portions and vertical portions. The horizontal portions may be provided on the upper support pattern S2, between the upper and lower support patterns S2 and S1 and under the lower support pattern S1. The vertical portions may penetrate the plurality of openings 140 to be connected to the horizontal portions.

The top electrode TE may cover the upper surface S2_U and the upper portion of the sidewall of the upper support pattern S2 and may extend on the uppermost surface BE_U of the bottom electrodes BE. The top electrode TE may be provided between the upper support pattern S2 and the lower support pattern S1 and under the lower support pattern S1 to cover the sidewalls of the bottom electrodes BE. At least a portion of the top electrode TE may cover the sidewalls of the bottom electrodes BE through the plurality of openings 140 which penetrate the upper support pattern S2 and the lower support pattern S1.

The capacitor structure CA may further include a dielectric layer 150 that is interposed between the support structure SS and the top electrode TE, and between each of the bottom electrodes BE and the top electrode TE.

The bottom electrodes BE and the top electrode TE may include at least one of polycrystalline silicon, metal, metal silicide and metal nitride. The dielectric layer 150 may include at least one of oxide material (e.g., a silicon oxide layer), nitride material (e.g., a silicon nitride layer), oxynitride material (e.g., a silicon oxynitride layer) or high-k dielectric material (e.g., a hafnium oxide layer). The lower and upper support patterns S1 and S2 may include insulation materials. As an example, the lower and upper support patterns S1 and S2 may include at least one of oxide material, nitride material and oxynitride material.

According to example embodiments of the inventive concept, the support structure SS may include the lower support pattern S1 and the upper support pattern S2, which are vertically spaced apart from each other, and the uppermost surface S2_U of the support structure SS may be positioned at a higher level than the uppermost surface BE_U of each of the bottom electrodes BE. For example, an upper end portion of each of the bottom electrodes BE may be in contact with one sidewall of the upper support pattern S2. Accordingly, the upper end portion of each of the bottom electrodes BE may be prevented from being bent. Accordingly, a capacitor structure and a semiconductor device with the capacitor structure may have better electrical properties and reliability.

Figure 27:
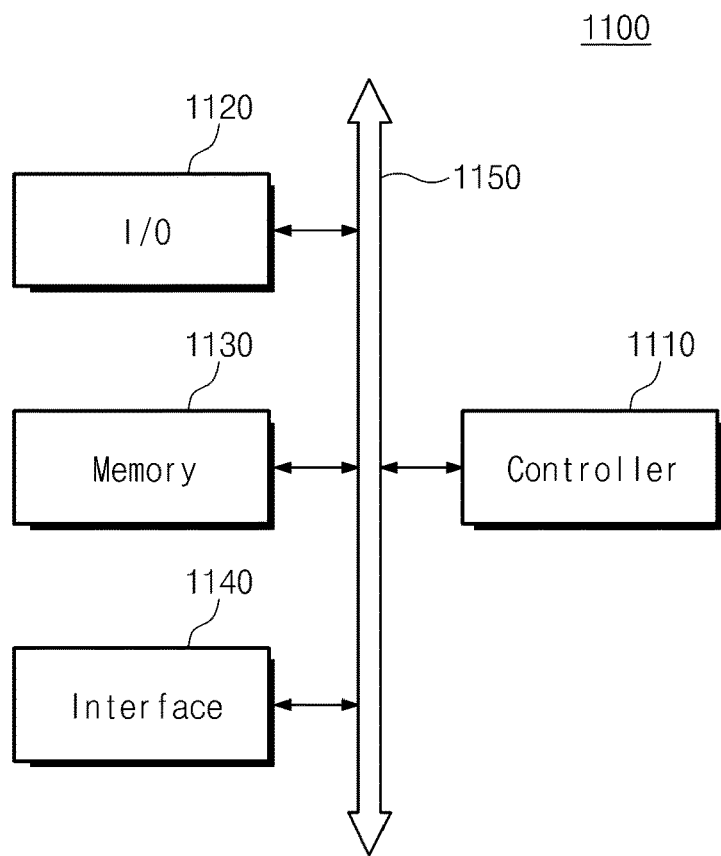
FIG. 27 is a schematic block diagram illustrating an example of electronic systems including a semiconductor device according to example embodiments of the inventive concept.

FIG. 27 is a schematic block diagram illustrating an example of electronic systems including a semiconductor device according to example embodiments of the inventive concept.

Referring to FIG. 27, an electronic system 1100 according to example embodiments of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The memory device 1130 may include one or more of the semiconductor devices according to example embodiments of the inventive concept. In other embodiments, the memory device 1130 may further include a semiconductor memory device of a different type from the semiconductor memory devices according to the afore-described embodiments of the inventive concept. The interface unit 1140 may transmit electrical data to a communication network or may receive electrical data from a communication network.

The electronic system 1100 may be applied to an electronic device such as a laptop computer, a personal digital assistant (PDA), a portable computer, a web tablet, a wireless phone, a mobile phone, a digital music player, a memory card or an electronic product.

Figure 28:
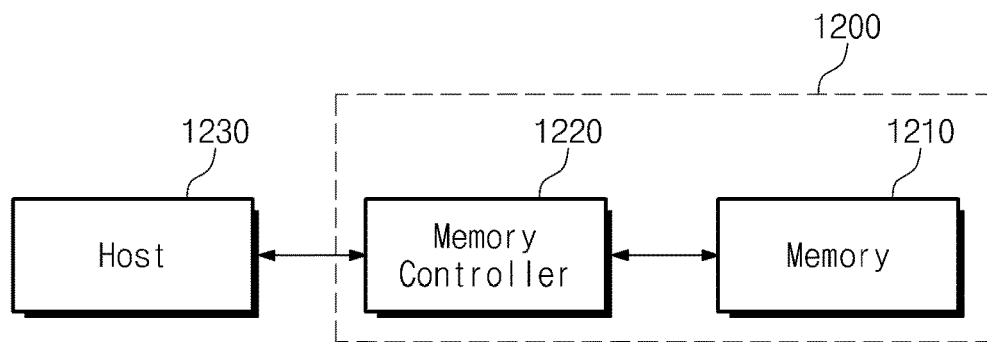
FIG. 28 is a schematic block diagram illustrating an example of memory cards including the semiconductor memory device according to the embodiments of the inventive concept.

FIG. 28 is a schematic block diagram illustrating an example of memory cards including the semiconductor memory device according to exemplary embodiments of the inventive concept.

Referring to FIG. 28, a memory card 1200 according to example embodiments of the inventive concept may include a memory device 1210. The memory device 1210 may include at least one of the semiconductor memory devices according to the afore-described embodiments of the inventive concept. In other embodiments, the memory device 1210 may further include a semiconductor memory device of a different type from the semiconductor memory devices according to the afore-described embodiments of the inventive concept. The memory card 1200 may include a memory controller 1220 that controls data communication between a host 1230 and the memory device 1210.

While example embodiments of the inventive concepts have been particularly shown and described, it will be understood by one of ordinary skill in the art that variations in form and detail may be made therein without departing from the spirit and scope of the attached claims.

What is claimed is:

1. A dynamic random access memory (DRAM) cell, comprising:
a capacitor structure on a substrate, the capacitor structure comprising:
a plurality of bottom electrodes horizontally spaced apart from each other on the substrate and arranged in an array having a plurality of rows of bottom electrodes, wherein the plurality of rows of bottom electrodes include a first row of bottom electrodes spaced apart from each other in a first direction, and a second row of bottom electrodes spaced apart from each other in the first direction, the second row of bottom electrodes are immediately next to the first row of bottom electrodes in a second direction perpendicular to the first direction, and the second row of bottom electrodes are offset from the first row of bottom electrodes with respect to the first direction;
a support structure covering sidewalls of the plurality of bottom electrodes, wherein the support structure includes an upper support pattern and a lower support pattern vertically spaced apart from each other, the upper support pattern contacting an upper portion of a sidewall of each bottom electrode of the plurality of bottom electrodes, and the lower support pattern contacting a lower portion of the sidewall of each bottom electrode of the plurality of bottom electrodes;
a top electrode surrounding the support structure and the plurality of bottom electrodes; and
a dielectric layer interposed between the support structure and the top electrode, and between the top electrode and each bottom electrode of the plurality of bottom electrodes,
wherein an uppermost surface of the upper support pattern of the support structure is positioned at a higher level than an uppermost surface of each bottom electrode of the plurality of bottom electrodes,
wherein the upper support pattern includes a plurality of first openings, each of the plurality of first openings extending to outer side surfaces of at least four bottom electrodes from among the first and second rows of bottom electrodes, and each of the plurality of first openings having a first outer boundary side that extends in the first direction and a second outer boundary side that extends in a third direction diagonal with respect to the first direction and the second direction, in a plan view, and
wherein the plurality of first openings include a pair of first openings next to each other in the second direction with at least one bottom electrode interposed therebetween, and the pair of first openings are offset from each other with respect to the first direction.

2. The DRAM cell of claim 1, wherein: the lower support pattern includes a plurality of second openings, each of the plurality of second openings extends to outer side surfaces of at least four bottom electrode from among two adjacent rows of the plurality of bottom electrodes, and each of the plurality of first openings overlaps with a corresponding one of the plurality of second openings.

3. The DRAM cell of claim 1, wherein the upper support pattern has a thickness greater than that of the lower support pattern.

4. The DRAM cell of claim 1, wherein a portion of a sidewall of the upper support pattern extends above the uppermost surface of each bottom electrode of the plurality of bottom electrodes.

5. The DRAM cell of claim 1, wherein each bottom electrode of the plurality of bottom electrodes is electrically connected to a drain region of a metal-oxide-semiconductor (MOS) transistor on the substrate.

6. The DRAM cell of claim 1, wherein for each first opening, the at least four bottom electrodes include a first bottom electrode, a second bottom electrode and a third bottom electrode that are immediately adjacent to each other, wherein each of the plurality of first openings has the first outer boundary side extending to outer side surfaces of the first bottom electrode and the second bottom electrode, and the second outer boundary side extending to outer side surfaces of the first bottom electrode and the third bottom electrode, and wherein the first outer boundary side is adjacent to the second outer boundary side to form an acute angle or an obtuse angle in the plan view.

7. A dynamic random access memory (DRAM) cell, comprising:

a capacitor structure on a substrate,
the capacitor structure comprising:
a plurality of bottom electrodes horizontally spaced apart from each other on the substrate and arranged in an array having a plurality of rows of bottom electrodes, wherein the plurality of rows of bottom electrodes include a first row of bottom electrodes spaced apart from each other in a first direction, and a second row of bottom electrodes spaced apart from each other in the first direction, the second row of bottom electrodes are immediately next to the first row of bottom electrodes in a second direction perpendicular to the first direction, and the second row of bottom electrodes are offset from the first row of bottom electrodes with respect to the first direction;

a support structure covering sidewalls of the plurality of bottom electrodes, wherein the support structure includes an upper support pattern and a lower support pattern vertically spaced apart from each other, the upper support pattern contacting an upper portion of a sidewall of each bottom electrode of the plurality of bottom electrodes, and the lower support pattern contacting a lower portion of the sidewall of each bottom electrode of the plurality of bottom electrodes;

a top electrode surrounding the support structure and the plurality of bottom electrodes; and a dielectric layer interposed between the support structure and the top electrode, and between the top electrode and each bottom electrode of the plurality of bottom electrodes, wherein an uppermost surface of the upper support pattern of the support structure is positioned at a higher level than an uppermost surface of each bottom electrode of the plurality of bottom electrodes, wherein the upper support pattern includes a plurality of first openings, each of the plurality of first openings extending to outer side surfaces of at least four bottom electrodes from among the first and second rows of bottom electrodes, wherein each of the plurality of first openings has a first boundary side extending to outer side surfaces of a first bottom electrode and a second bottom electrode among the at least four bottom electrodes in the first direction, and an adjacent second boundary side extending to outer side surfaces of the first bottom electrode and a third bottom electrode among the at least four bottom electrodes in a third direction diagonal with respect to the first direction and the second direction, and wherein an angle between the first boundary side and the second boundary side is an acute angle or an obtuse angle in a plan view, wherein the plurality of first openings include a pair of first openings next to each other in the second direction with at least one bottom electrode interposed therebetween, and the pair of first openings are offset from each other with respect to the first direction.

8. The DRAM cell of claim 7, wherein the first bottom electrode and the second bottom electrode are included in the first row, and the third bottom electrode is included in the second row.

9. The DRAM cell of claim 7, wherein each of the plurality of first openings has a parallelogram shape in the plan view.

10. The DRAM cell of claim 7, wherein: the lower support pattern includes a plurality of second openings, each of the plurality of second openings extends to outer side surfaces of at least four bottom electrodes from among two adjacent rows of the plurality of bottom electrodes, and each of the plurality of first openings overlaps with a corresponding one of the plurality of second openings.

11. The DRAM cell of claim 7, wherein the upper support pattern has a thickness greater than that of the lower support pattern.

12. The DRAM cell of claim 7, wherein a portion of a sidewall of the upper support pattern extends above the uppermost surface of each bottom electrode of the plurality of bottom electrodes.

13. The DRAM cell of claim 7, wherein each bottom electrode of the plurality of bottom electrodes is electrically connected to a drain region of a metal-oxide-semiconductor (MOS) transistor on the substrate.

* * * * *